US012549139B2

(12) United States Patent
Joly et al.

(10) Patent No.: US 12,549,139 B2
(45) Date of Patent: Feb. 10, 2026

(54) RADIO FREQUENCY POWER AMPLIFIER IMPLEMENTING AN OFF MODE OUTPUT IMPEDANCE CONTROL AND A PROCESS OF IMPLEMENTING THE SAME

(71) Applicant: MACOM Technology Solutions Holdings, Inc., Lowell, MA (US)

(72) Inventors: Christophe Joly, Sacramento, CA (US); Michael Devita, Mesa, AZ (US)

(73) Assignee: Macom Technology Solutions Holdings Inc., Lowell, MA (US)

( * ) Notice: Subject to any disclaimer, the term of this patent is extended or adjusted under 35 U.S.C. 154(b) by 554 days.

(21) Appl. No.: 18/061,246

(22) Filed: Dec. 2, 2022

(65) Prior Publication Data

US 2024/0186960 A1    Jun. 6, 2024

(51) Int. Cl.
    *H03F 1/56*      (2006.01)
    *H03F 3/24*      (2006.01)

(52) U.S. Cl.
    CPC .............. *H03F 1/56* (2013.01); *H03F 3/245* (2013.01); *H03F 2200/387* (2013.01); *H03F 2200/451* (2013.01)

(58) Field of Classification Search
    CPC ...... H03F 1/56; H03F 3/245; H03F 2200/387; H03F 2200/451
    USPC .......................................................... 330/291
See application file for complete search history.

(56) References Cited

U.S. PATENT DOCUMENTS

| 2002/0190790 | A1* | 12/2002 | Cheng | ............... H03F 1/14 330/51 |
| 2008/0218260 | A1* | 9/2008 | Quaglietta | ............... H03F 1/56 330/126 |
| 2011/0187437 | A1 | 8/2011 | Perreault et al. | |
| 2022/0149725 | A1 | 5/2022 | Garrett et al. | |

FOREIGN PATENT DOCUMENTS

TW      M392430 U   *   11/2010

OTHER PUBLICATIONS

All About Wireless: Transmission Lines, Part I—Shure USA (Year: 2025).*
International Patent Application No. PCT/US2023/81993; Int'l Search Report and the Written Opinion; dated May 17, 2024; 17 pages.

* cited by examiner

*Primary Examiner* — Hafizur Rahman
(74) *Attorney, Agent, or Firm* — BakerHostetler

(57) ABSTRACT

A device may include an input port; a RF output port; a RF amplifier device; and an off mode output impedance control.

25 Claims, 31 Drawing Sheets

FIG. 8

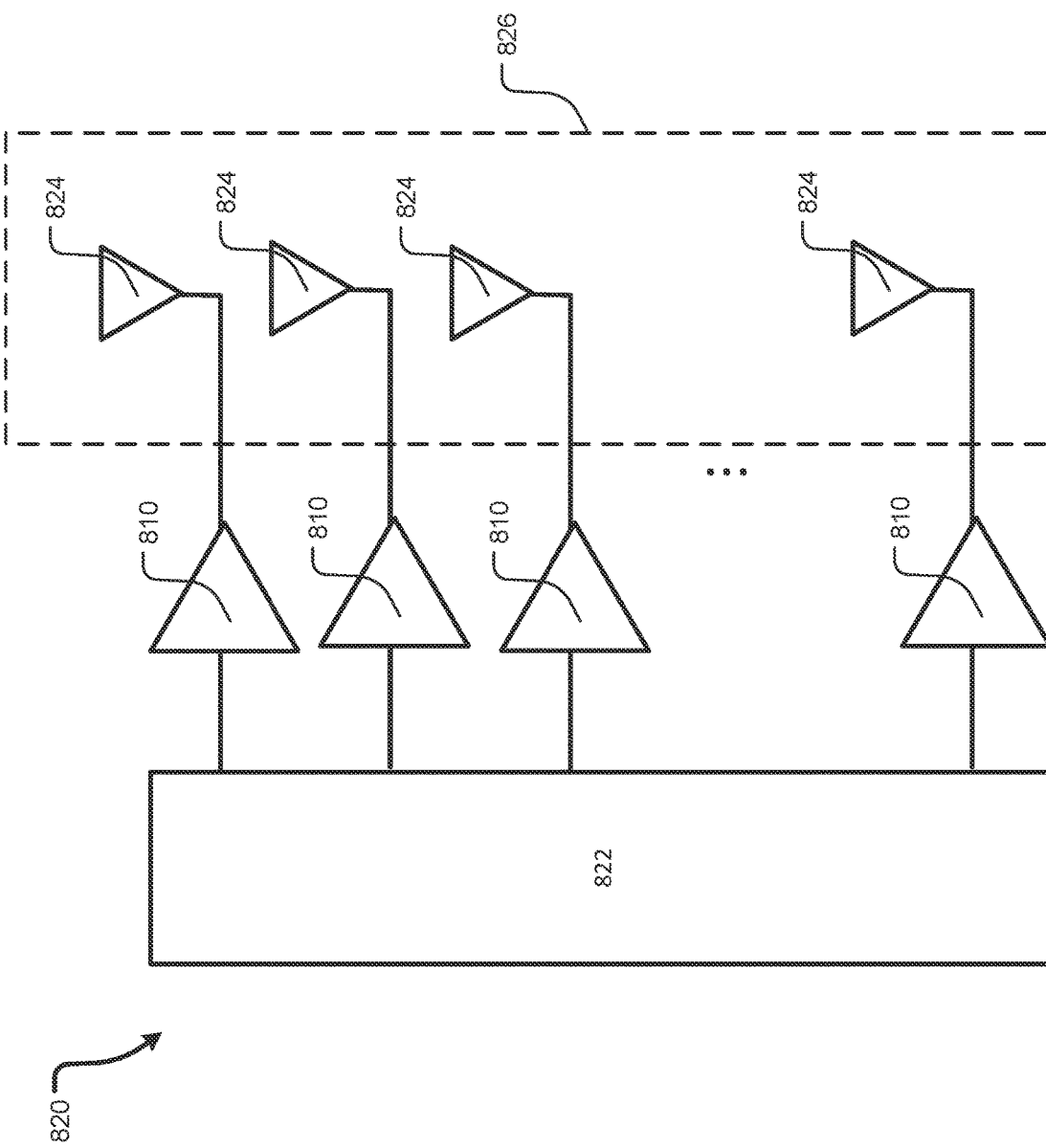

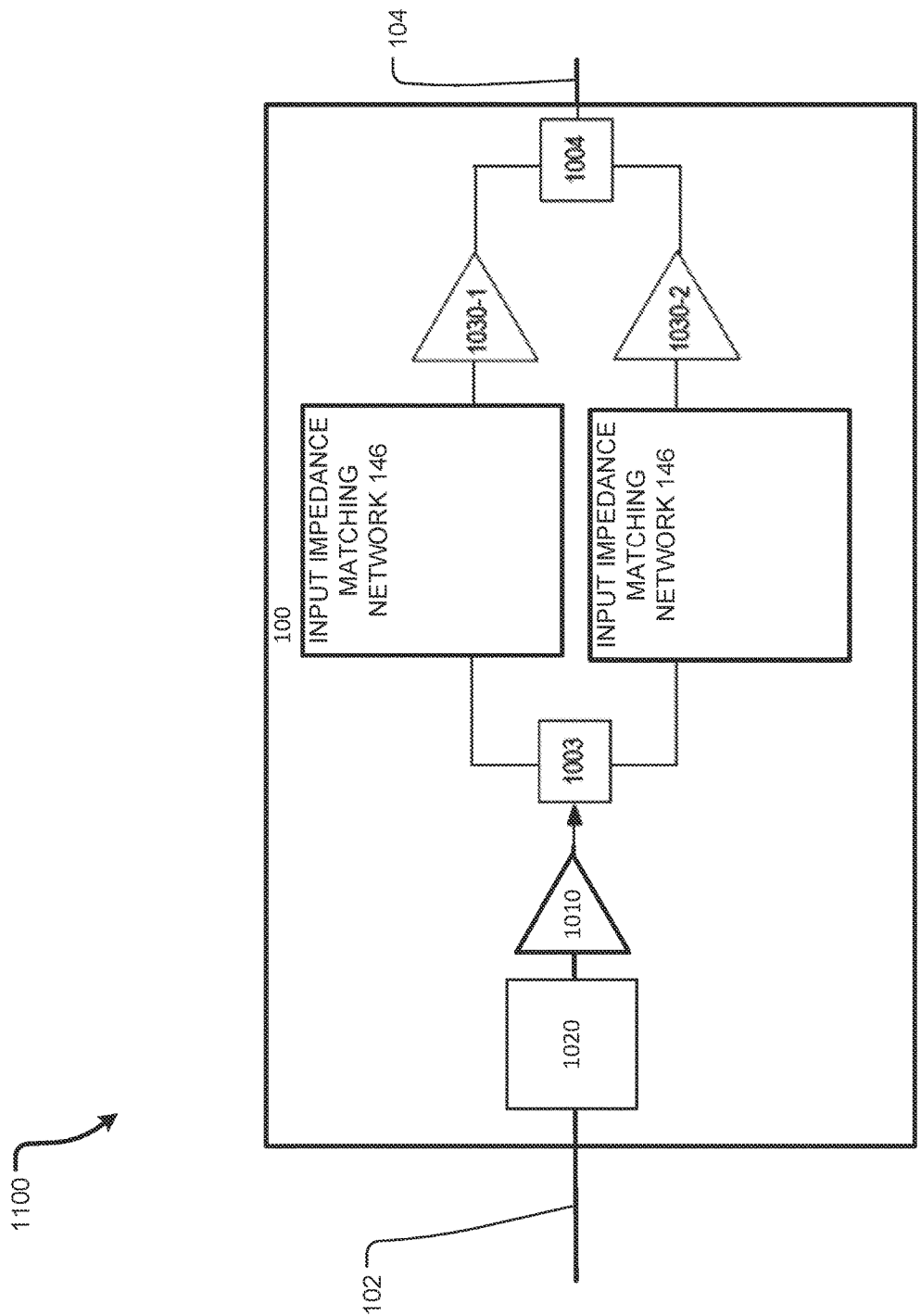

RADIO FREQUENCY POWER AMPLIFIER IMPLEMENTING AN OFF MODE OUTPUT IMPEDANCE CONTROL AND A PROCESS OF IMPLEMENTING THE SAME

FIELD OF THE DISCLOSURE

The disclosure relates to a radio frequency power amplifier implementing an off mode output impedance control. Additionally, the disclosure relates to a process of implementing a radio frequency power amplifier implementing an off mode output impedance control.

BACKGROUND OF THE DISCLOSURE

Radio Frequency (RF) power amplifiers are used in a variety of applications such as base stations for wireless communication systems, wireless communication devices, and/or the like. The RF power amplifiers can typically include a transistor die to amplify the RF signal. These devices typically have relatively low characteristic impedances (for example, 2 ohm or less). Input and output impedance matching circuits are typically used to match the RF power amplifiers to external transmission lines that provide RF signals to and from a RF power amplifiers. These external transmission lines have characteristic impedances that are typically about 50 ohm. However, the characteristic impedances could be any value as determined by a designer, needed for a particular application and/or system, and/or the like. The input and output matching circuits typically include inductive and capacitive elements that are used to provide impedance matching between the input and output of the RF power amplifiers.

Because of the nature of RF power amplifiers, one or more scattering parameters or S-parameters, such as S22, are typically not a controlled parameter to obtain amplifier performance, such as efficiency, power, gain, and/or the like. In particular, the S22 parameter, which can also be referred to as Output Impedance, is typically not a controlled parameter to obtain amplifier performance, such as efficiency, power, gain, and/or the like. In this regard, the S22 parameter is an output port voltage reflection coefficient. For RF power amplifiers where only gain is a concern, the S22 parameter is typically controlled and close to a target impedance in an ON mode, also referred to as an operating mode or a biased mode.

However, for some specific uses, the RF power amplifiers need to present a close to 50 ohm impedance in an OFF mode, also known as a non-operating mode or unbiased mode. This specification is often referred to OFF mode S22.

The amplifying device, such as Field-Effect Transistor (FET), a bipolar device such as Gallium Nitride (GaN) device, a Metal-Oxide-Semiconductor Field-Effect Transistor (MOSFET) device, a Laterally Diffused MOSFET (LDMOS) device, a complementary metal-oxide semiconductor (CMOS) device and/or the like have a dramatically different impedance in On mode and Off mode. In this regard, often in Off mode the impedance of the device is actually closer to an outer edge of a Smith chart. For example, the S22 parameter is typically about −1 dB, whereas the target is approximately less than −10 dB. Accordingly, without a specific impedance control, it is not possible to meet the Off mode impedance, other amplifier specifications described herein, and/or the like.

The current technology typically does not implement Off mode impedance control. However, it is sometimes possible to slightly modify this specific parameter by compromising other parameters but not to the full extent of bringing the off-mode S22 parameter where desired.

When both On mode and Off mode impedances are critical, a circulator is sometimes used. Because of the size of the circulator, a circulator cannot be practically implemented in modules. Moreover, as a circulator is typically implemented in line, a circulator also induces some losses, degradations, and/or the like. When a transmit/receive (T/R) switch is used, such as in Time-Division Duplex (TDD) systems, the S22 parameter off mode impedance is equal to a Rx input impedance. This will provide a suitable Off-mode impedance, but will also include losses. In this regard, it is important not to degrade a third order intercept (IP3) of the overall amplifier, such as ensuring the transmit/receive (T/R) switch is sized properly.

Accordingly, there is a need for implementing a RF power amplifier configured to provide Off mode impedance control with limited impact on the RF power amplifier performance.

SUMMARY OF THE DISCLOSURE

In one general aspect, a RF power amplifier circuit includes an input port. The RF power amplifier circuit in addition includes a RF output port. The RF power amplifier circuit moreover includes a RF amplifier device. The RF power amplifier circuit also includes an off mode output impedance control.

In one general aspect, a process includes providing an input port. The process in addition includes providing a RF output port. The process moreover includes providing a RF amplifier device. The process also includes providing an off mode output impedance control.

In one general aspect, the RF power amplifier circuit includes an input port. The RF power amplifier circuit in addition includes a RF output port. The RF power amplifier circuit moreover includes a RF amplifier device. The RF power amplifier circuit also includes an output impedance control, where the output impedance control may include an impedance circuit and at least one switch circuit.

In one general aspect, the process includes providing an input port. The process in addition includes providing a RF output port. The process moreover includes providing a RF amplifier device. The process also includes providing an output impedance control, where the output impedance control may include an impedance circuit and at least one switch circuit.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIG. 8 illustrates an exemplary implementation of the off mode output impedance control according to aspects of the disclosure.

FIG. 21B illustrates an exemplary implementation of a Massive Multiple-Input and Multiple-Output (MMIMO) simplified front end antenna architecture according to aspects of the disclosure.

FIG. 21E illustrates a block diagram of an exemplary implementation of a RF power amplifier circuit according to FIG. 1 implemented as a multiple stage amplifier where the last stage is either a quadrature or balanced stage.

DETAILED DESCRIPTION OF THE DISCLOSURE

Figure 1:
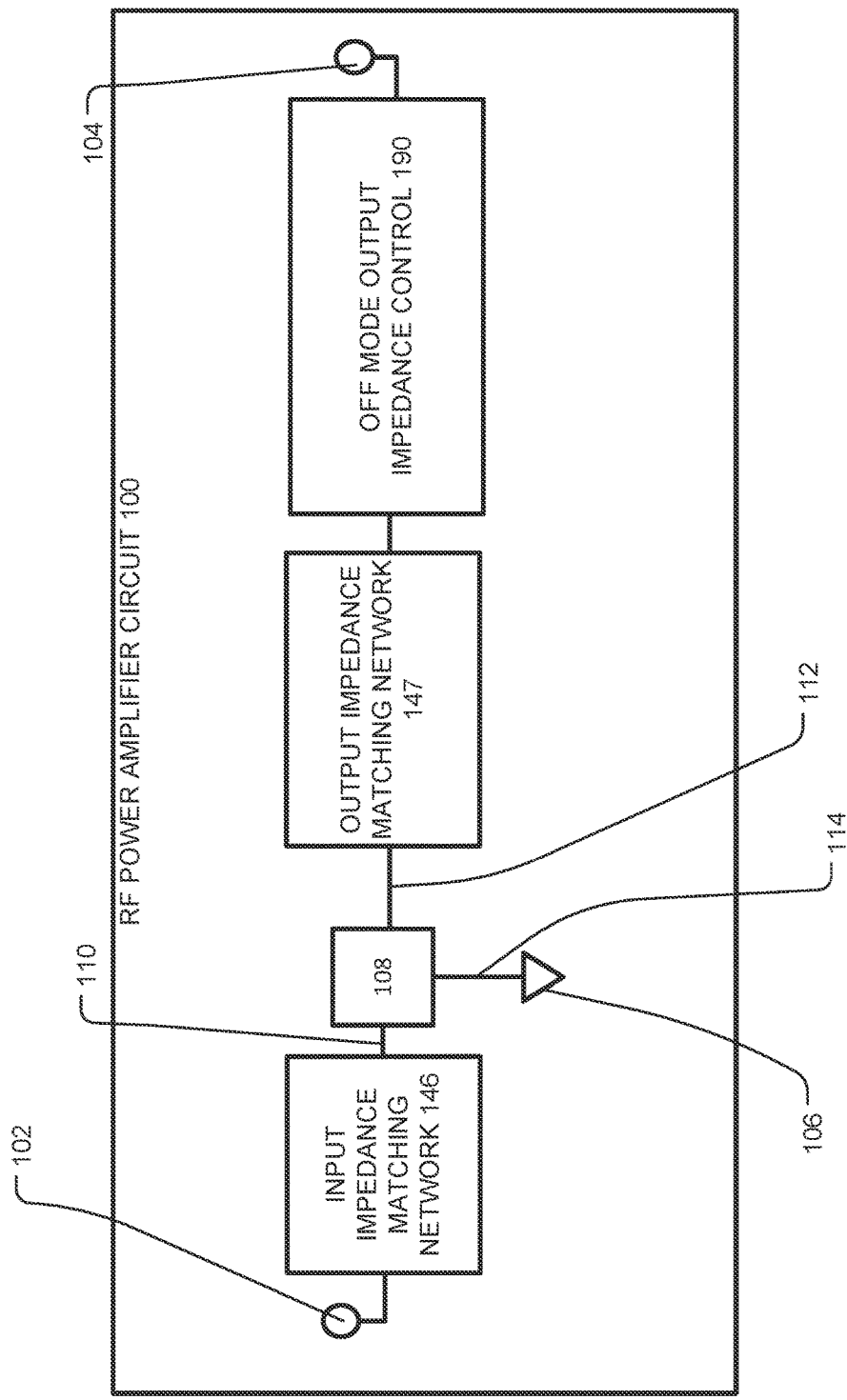
FIG. 1 illustrates a functional block diagram of a RF power amplifier circuit according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects of the disclosure may be implemented in any RF power amplifier where an S22 parameter specification in Off mode is present, beneficial, needed, and/or the like. For example, an S22 parameter Off mode specification may be related to a need in a system to partially shut down and/or only partially operate one or more power amplifiers. In this regard, this may be related to Multiple-Input Multiple-Output (MIMO) systems, massive MIMO (mMIMO) systems, 5G systems, and/or the like. Further, this may be related to a coexistence of one or more power amplifiers in a wireless device. A "wireless device" is intended to encompass any compatible mobile technology computing device that can connect to a wireless communication network, such as mobile phones, mobile equipment, mobile stations, user equipment, cellular phones, smartphones, handsets, wireless dongles, remote alert devices, Internet of things (IoT) based wireless devices, or other mobile computing devices that may be supported by a wireless network. Off-mode S22 parameters are often an issue where there is coexistence of several amplifiers in systems.

Aspects of the disclosure may provide for an Off-mode control using an additional Off-mode switch that implements an impedance correction. Aspects of the disclosure may implement a switch circuit, such as Field-Effect Transistor (FET) switch circuit. Aspects of the disclosure may implement the switch at the output of a module, amplifier, and/or the like. Aspects of the disclosure may be implemented without a circulator. Aspects of the disclosure may be implemented such that the S22 parameter in Off mode is significantly close to 50 ohm.

FIG. 1 illustrates a functional block diagram of a RF power amplifier circuit according to the disclosure.

In particular, FIG. 1 illustrates a RF power amplifier circuit 100. The RF power amplifier circuit 100 may include an input port 102, a RF output port 104, and a reference potential port 106. The RF power amplifier circuit 100 additionally may include a RF amplifier device 108, an output impedance matching network 147, and an off mode output impedance control 190. In aspects, the RF power amplifier circuit 100 additionally may include an input impedance matching network 146; however, implementation of the input impedance matching network 146 is not necessarily directly related to the disclosed implementation of the off mode output impedance control 190. In aspects, the RF power amplifier circuit 100 may be implemented in the system where the RF power amplifier circuit 100 may operate in an on mode; and the RF power amplifier circuit 100 may be implemented in the system where the RF power amplifier circuit 100 may also be configured in an off mode.

In aspects, the RF power amplifier circuit 100 configured with the off mode output impedance control 190 may be an implementation where an S22 parameter specification in an Off mode is present, beneficial, needed, and/or the like. For example, an S22 parameter Off mode specification may be related to a need in a system implementing the RF power amplifier circuit 100 to partially shut down and/or only partially operate one or more implementations of the RF power amplifier circuit 100. In this regard, the RF power amplifier circuit 100 configured with the off mode output impedance control 190 may be implemented in one or more of a Multiple-Input Multiple-Output (MIMO) system, a massive MIMO (mMIMO) system, a 5G system, and/or the like. Further, the RF power amplifier circuit 100 configured with the off mode output impedance control 190 may be implemented to coexist with one or more other power amplifiers in a wireless device, as defined herein.

In aspects, the RF power amplifier circuit 100 configured with the off mode output impedance control 190 may address the Off-mode S22 parameters that may often be an issue where there is coexistence of several amplifiers in a system. Aspects of the disclosure may implement the RF power amplifier circuit 100 configured with the off mode output impedance control 190 without a circulator. Aspects of the disclosure may implement the RF power amplifier circuit 100 configured with the off mode output impedance control 190 such that the S22 parameter in the Off mode is significantly close to 50 ohm.

In aspects, the off mode output impedance control 190 may control the associated S22 parameter of the RF power amplifier circuit 100 in an off mode such that the S22 parameter of the RF power amplifier circuit 100 in an off mode is less than −7 dB, −10 dB, −15 dB, −20 dB or −25 dB. In aspects, the off mode output impedance control 190 may control the associated S22 parameter of the RF power amplifier circuit 100 in an off mode such that the output impedance of the RF power amplifier circuit 100 in an off mode is between 17 ohms and 150 ohms, 25 ohms and 100 ohms, 33 ohms and 75 ohms, or 45 ohms and 55 ohms.

The RF amplifier device 108 may have an input terminal 110 electrically coupled to the input port 102 through the input impedance matching network 146. The RF amplifier device 108 may include an output terminal 112 electrically coupled to the RF output port 104 and a reference potential terminal 114 electrically coupled to the reference potential port 106. Additionally, the RF power amplifier circuit 100 may further include the off mode output impedance control 190 electrically coupled between the output terminal 112 and the RF output port 104.

In one or more aspects, the off mode output impedance control 190 may be integrated into the RF power amplifier circuit 100, the off mode output impedance control 190 may be integrated into a package housing the RF power amplifier circuit 100, the off mode output impedance control 190 may be implemented in the RF power amplifier circuit 100 separate from a system implementing the RF power amplifier circuit 100, and/or the like.

In aspects, the input impedance matching network 146 and the output impedance matching network 147 may be implemented with various circuit combinations of one or more capacitors, one or more inductors, and/or the like.

Figure 2:
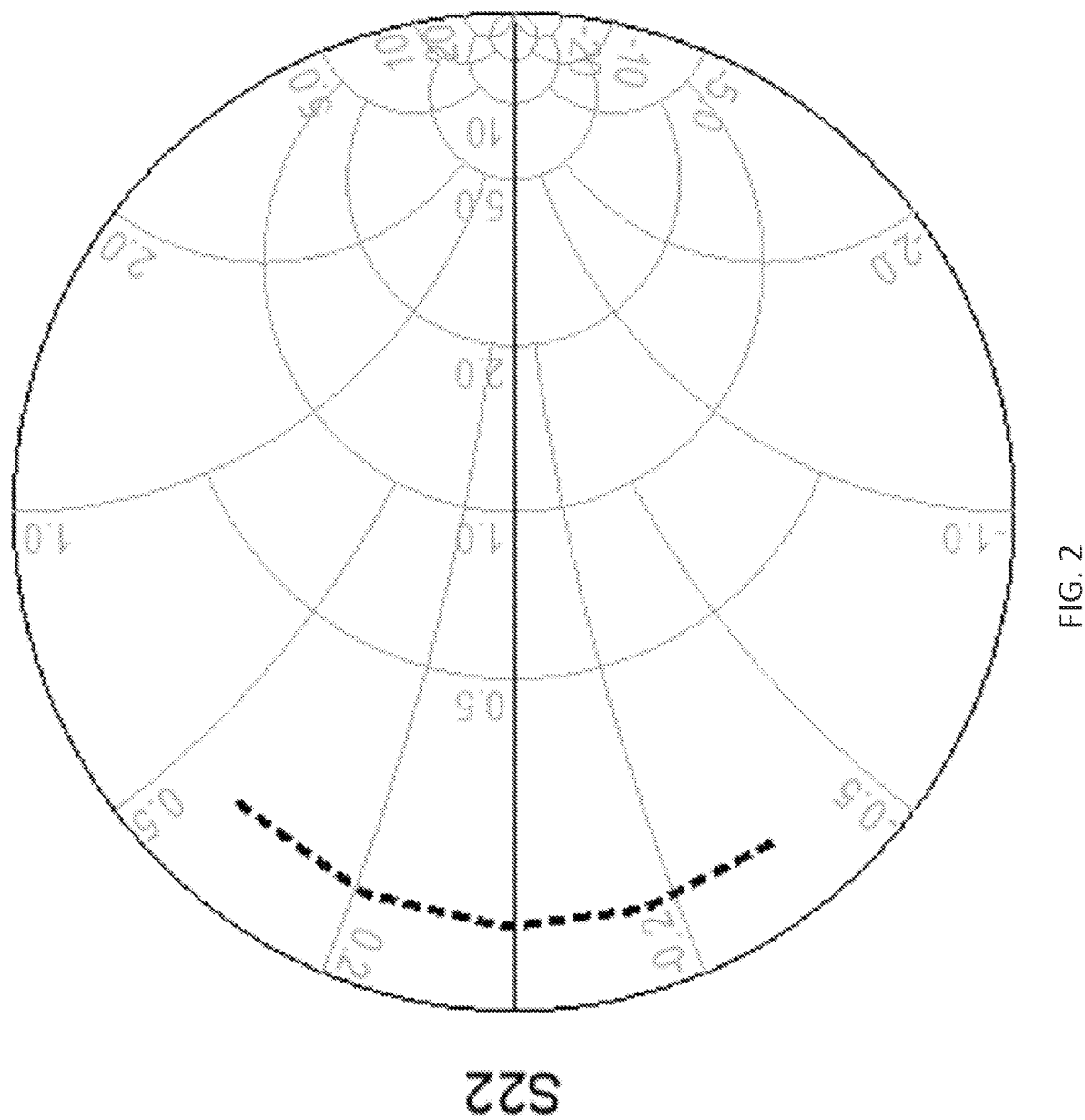
FIG. 2 illustrates simulation results of an off mode power amplifier implemented without the off mode output impedance control of the disclosure.

FIG. 2 illustrates simulation results of an off mode power amplifier implemented without the off mode output impedance control of the disclosure.

In particular, FIG. 2 illustrates simulation results of a S22 parameter in an off mode power amplifier implemented without the off mode output impedance control 190 of the disclosure. The S22 parameter is shown by the dashed line. More specifically, FIG. 2 illustrates simulation results of a S22 parameter of an off mode power amplifier implemented without the off mode output impedance control 190 of the disclosure, where the amplifier is implemented with 40 dBm at 2.5-2.7 GHz. As illustrated by FIG. 2, the S22 parameter of the power amplifier is approximately −1.5 dB and approximately 4 ohms, which is unsatisfactory for numerous systems.

Figure 3:
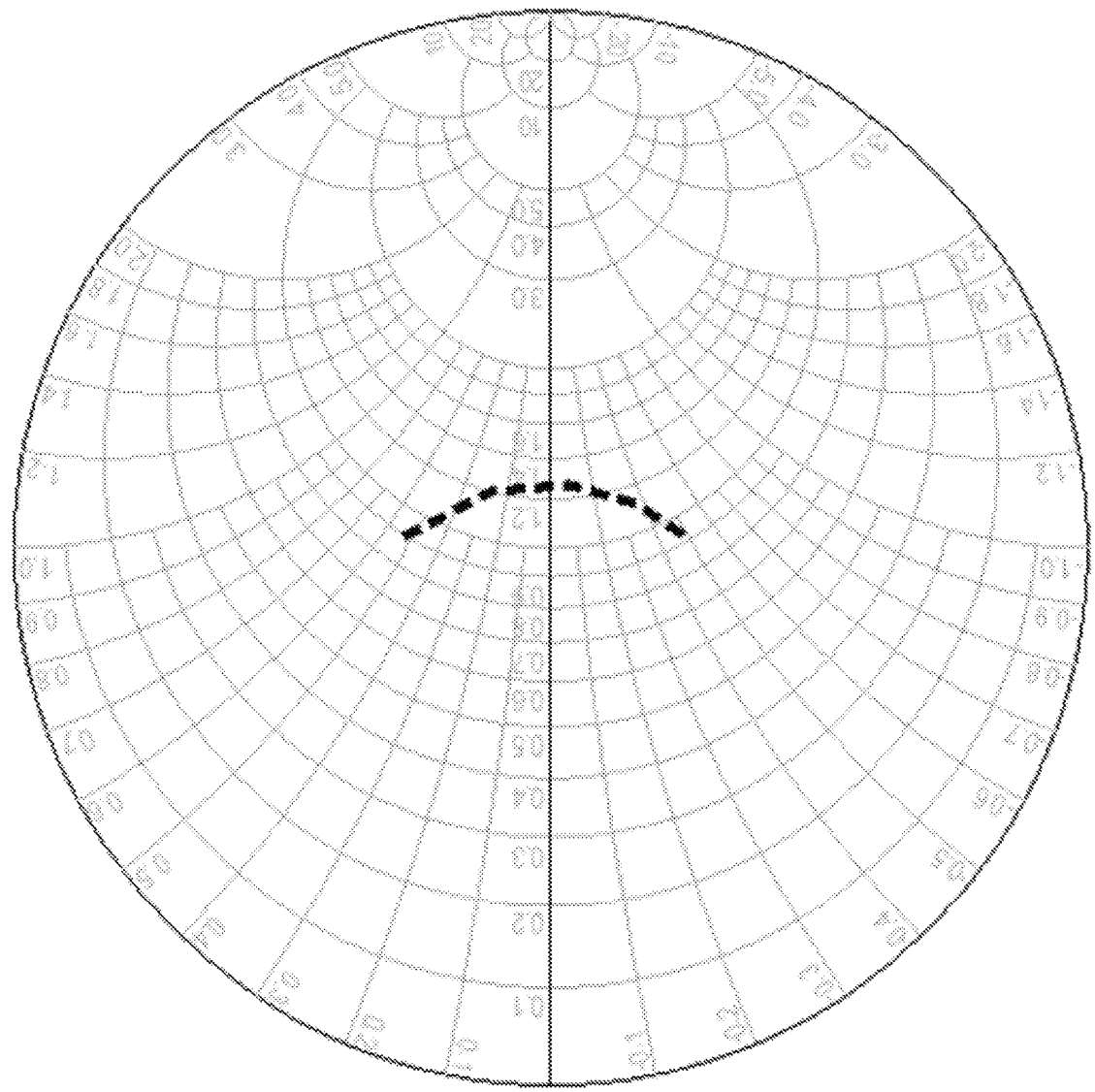
FIG. 3 illustrates simulation results of an off mode power amplifier implemented with the off mode output impedance control of the disclosure.

FIG. 3 illustrates simulation results of an off mode power amplifier implemented with the off mode output impedance control of the disclosure.

In particular, FIG. 3 illustrates simulation results of a S22 parameter of an off mode power amplifier implemented with the off mode output impedance control 190 of the disclosure. The S22 parameter is shown by the dashed line. More specifically, FIG. 3 illustrates simulation results of a S22 parameter on an off mode power amplifier implemented with the off mode output impedance control 190 of the disclosure, where the amplifier is implemented with 40 dBm at 2.5-2.7 GHz. As illustrated by FIG. 3, the S22 parameter of the power amplifier is approximately −10 dB or better and output impedance between 25 and 100 ohms, which is satisfactory for numerous systems where the system impedance is 50 ohm and the impedance may vary by a factor of two.

Figure 4:
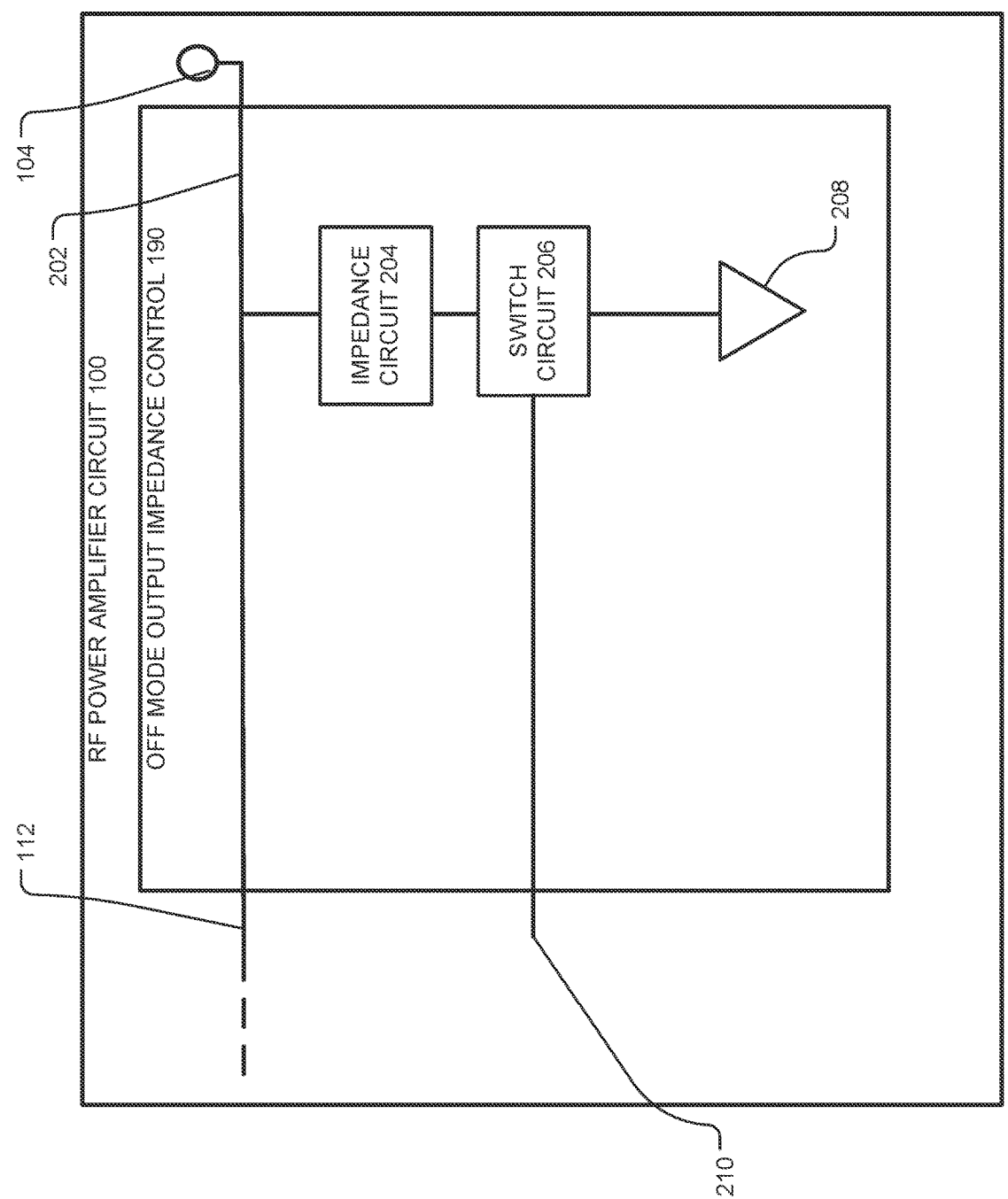
FIG. 4 illustrates an exemplary implementation of the off mode output impedance control according to aspects of the disclosure.

FIG. 4 illustrates an exemplary implementation of the off mode output impedance control according to aspects of the disclosure.

In particular, FIG. 4 illustrates an exemplary implementation of the off mode output impedance control 190. The aspects of FIG. 4 may include any other aspects as disclosed herein; and moreover aspects of FIG. 4 may be implemented in other aspects described herein. The off mode output impedance control 190 may include a mainline 202, an impedance circuit 204, and at least one switch circuit 206. The mainline 202 may extend between the output terminal 112 and the RF output port 104 of the RF power amplifier circuit 100. Additionally, the impedance circuit 204 and the at least one switch circuit 206 may connect to the mainline 202; and the impedance circuit 204 and the at least one switch circuit 206 may connect to ground 208. Further, the at least one switch circuit 206 may include a control input 210. As illustrated in FIG. 4, the impedance circuit 204 may connect in series with the at least one switch circuit 206 between the ground 208 and the mainline 202.

In aspects, the at least one switch circuit 206 may be active when the RF power amplifier circuit 100 is not active and vice versa. In this regard, the control input 210 may control the at least one switch circuit 206 to be active when the RF power amplifier circuit 100 is not active; and the control input 210 may control the at least one switch circuit 206 to not be active when the RF power amplifier circuit 100 is active. In aspects, the control input 210 may be implemented at a system level with an additional input associated with the RF power amplifier circuit 100, such as an input pin, to receive a signal and provide the signal, as the control input 210, to the at least one switch circuit 206. In aspects, the control input 210 may be implemented a controller associated with the RF power amplifier circuit 100, such as a controller chip, to provide a signal, as the control input 210, to the at least one switch circuit 206. In particular aspects, the controller may implement four controls used for the driver device, the carrier device, and the peaker device. Accordingly, a fourth control may be utilized to provide the control input 210 to the at least one switch circuit 206.

Aspects of the off mode output impedance control 190 may implement an Off-mode control using the at least one switch circuit 206 implemented as an Off-mode switch that implements an impedance correction. The impedance circuit 204 may be configured in the off mode output impedance control 190 to provide the impedance correction. In aspects, the at least one switch circuit 206 may be implemented by a plurality of switching devices in series. In aspects, the at least one switch circuit 206 may be implemented as a FET. However, the at least one switch circuit 206 may be implemented by any type of transistor switch including a CMOS switch, a GaAs FET switch, a GaN FET switch, a bipolar switch, a solid state relay, an optocoupler and/or the like.

In aspects, the at least one switch circuit 206 may be implemented as a FET. However, the at least one switch circuit 206 and/or the off mode output impedance control 190 may include further supporting components, not illustrated, such as decoupling circuits, biasing circuits, and/or the like. The switch device implementations of the at least one switch circuit 206 may need to be biased and the breakdown voltage of the switch device implementations of the at least one switch circuit 206 may be essential to the function, as it relates to the amount of power being transmitted.

In this regard, the switch device implementations of the at least one switch circuit 206 may be implemented as a stack of switch devices, such as FETs, to be able to handle a total voltage excursion of an output power of the RF power amplifier circuit 100. The typical maximum excursion in a linear implementation of a power amplifier is equal to sqrt(8*Pmax*Z0), with Z0=50, usually. For very high power amplifiers, the switch device implementations of the at least one switch circuit 206 may utilize GaN devices due to their high breakdown and good thermal dissipation. There are other considerations for the switch device implementations of the at least one switch circuit 206 such as proper margin to avoid breakdown. For example, in aspects implementing a FET for the switch device implementations of the at least one switch circuit 206, the FET size needs to be considered to avoid any linearity degradation. Accordingly, a number of the FETs implemented by the at least one switch circuit 206 may need to increase accordingly. Since a breakdown voltage is not a variable number in each process, the switch device implementations of the at least one switch circuit 206, such as FETs, are usually stacked.

In aspects, operation of the off mode output impedance control 190 to provide correction of impedance for the RF power amplifier circuit 100 may be implemented by closing the at least one switch circuit 206 to close the circuit between the ground 208 and the mainline 202 and provide an impedance correction provided by the impedance circuit 204. In aspects, closing the at least one switch circuit 206 may be in response to receiving a signal at the control input 210. In aspects, the at least one switch circuit 206 may be a transistor and the control input 210 may provide an input to control of the switch (the control terminal of the switch may be a gate, as in a FET device, a base as in a bipolar device, a logic input as in an optocoupler, etc.).

With reference to FIG. 4, the impedance circuit 204 may be connected to the mainline 202 and the at least one switch circuit 206 may be connected to the ground 208. In aspects, the impedance circuit 204 may be directly connected to the mainline 202 and the at least one switch circuit 206 may be directly connected to the ground 208.

Figure 5:
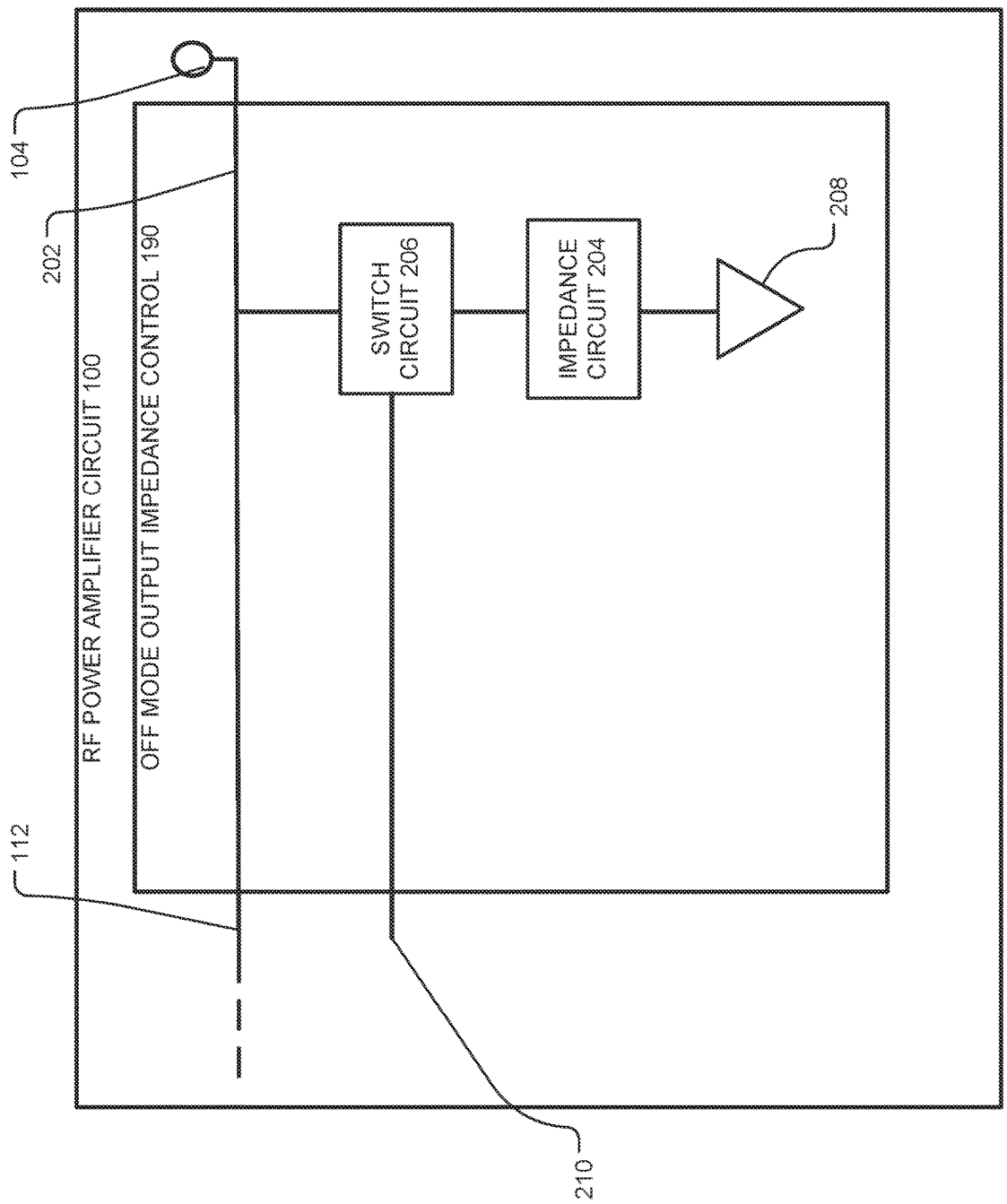
FIG. 5 illustrates an exemplary implementation of the off mode output impedance control according to aspects of the disclosure.

FIG. 5 illustrates an exemplary implementation of the off mode output impedance control according to aspects of the disclosure.

In particular, FIG. 5 illustrates an exemplary implementation of the off mode output impedance control 190. The aspects of FIG. 5 may include any other aspects as disclosed herein; and moreover aspects of FIG. 5 may be implemented in other aspects described herein.

With reference to FIG. 5, the at least one switch circuit 206 may be connected to the mainline 202 and the impedance circuit 204 may be connected to the ground 208. In aspects, the at least one switch circuit 206 may be directly connected to the mainline 202 and the impedance circuit 204 may be directly connected to the ground 208.

Figure 6:
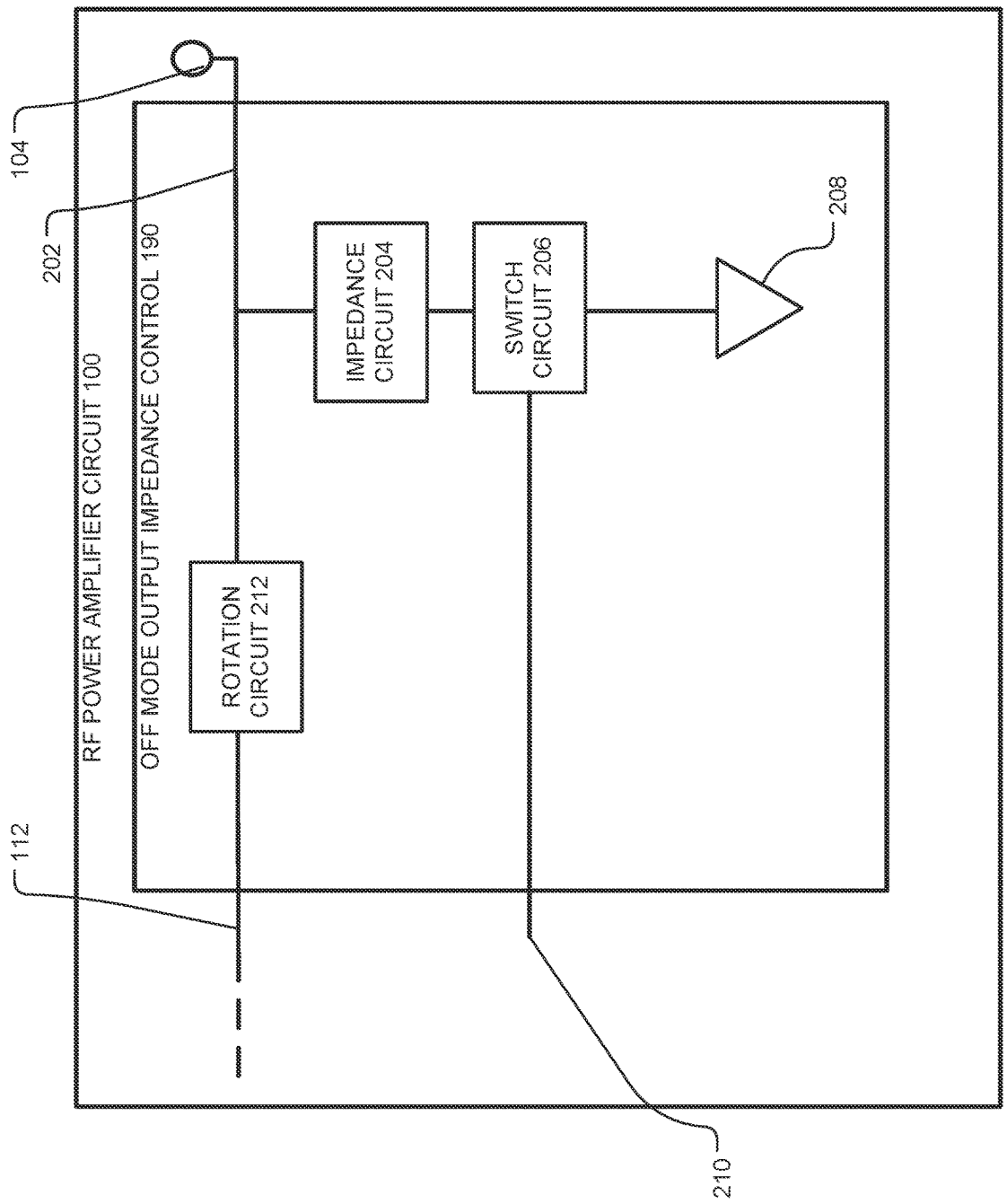
FIG. 6 illustrates an exemplary implementation of the off mode output impedance control according to aspects of the disclosure.

FIG. 6 illustrates an exemplary implementation of the off mode output impedance control according to aspects of the disclosure.

In particular, FIG. 6 illustrates an exemplary implementation of the off mode output impedance control 190. The aspects of FIG. 6 may include any other aspects as disclosed herein; and moreover aspects of FIG. 6 may be implemented in other aspects described herein.

With reference to FIG. 6, the off mode output impedance control 190 may further include a rotation circuit 212. The rotation circuit 212 may be arranged in line on the mainline 202. In aspects, the rotation circuit 212 may provide the required amount of phase rotation around 50 ohms (or any other system characteristic impedance). In aspects, the rotation circuit 212 may be implemented with a transmission line of the same characteristic impedance, a discrete component equivalent, and/or the like. With reference to FIG. 6, the impedance circuit 204 may be connected to the mainline 202 and the at least one switch circuit 206 may be connected to the ground 208. In aspects, the impedance circuit 204 may be directly connected to the mainline 202 and the at least one switch circuit 206 may be directly connected to the ground 208.

Figure 7:
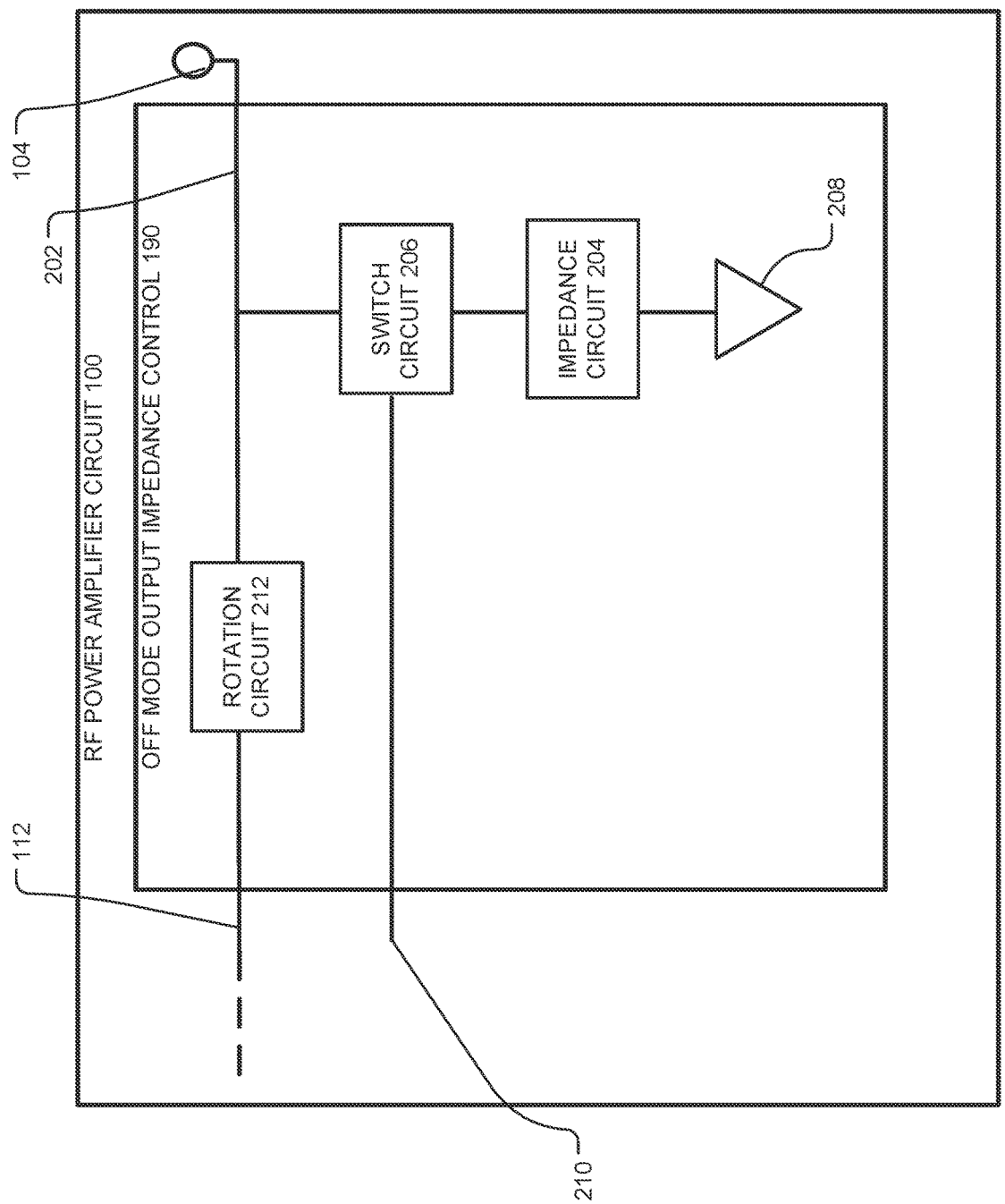
FIG. 7 illustrates an exemplary implementation of the off mode output impedance control according to aspects of the disclosure.

FIG. 7 illustrates an exemplary implementation of the off mode output impedance control according to aspects of the disclosure.

In particular, FIG. 7 illustrates an exemplary implementation of the off mode output impedance control 190. The aspects of FIG. 7 may include any other aspects as disclosed herein; and moreover aspects of FIG. 7 may be implemented in other aspects described herein.

With reference to FIG. 7, the off mode output impedance control 190 may further include the rotation circuit 212. The rotation circuit 212 may be arranged in line on the mainline 202. In aspects, the rotation circuit 212 may provide approximately 50 ohms of rotation. With reference to FIG. 7, the impedance circuit 204 may be connected to the mainline 202 and the at least one switch circuit 206 may be connected to the ground 208. In aspects, the impedance circuit 204 may be directly connected to the mainline 202 and the at least one switch circuit 206 may be directly connected to the ground 208.

Figure 8:
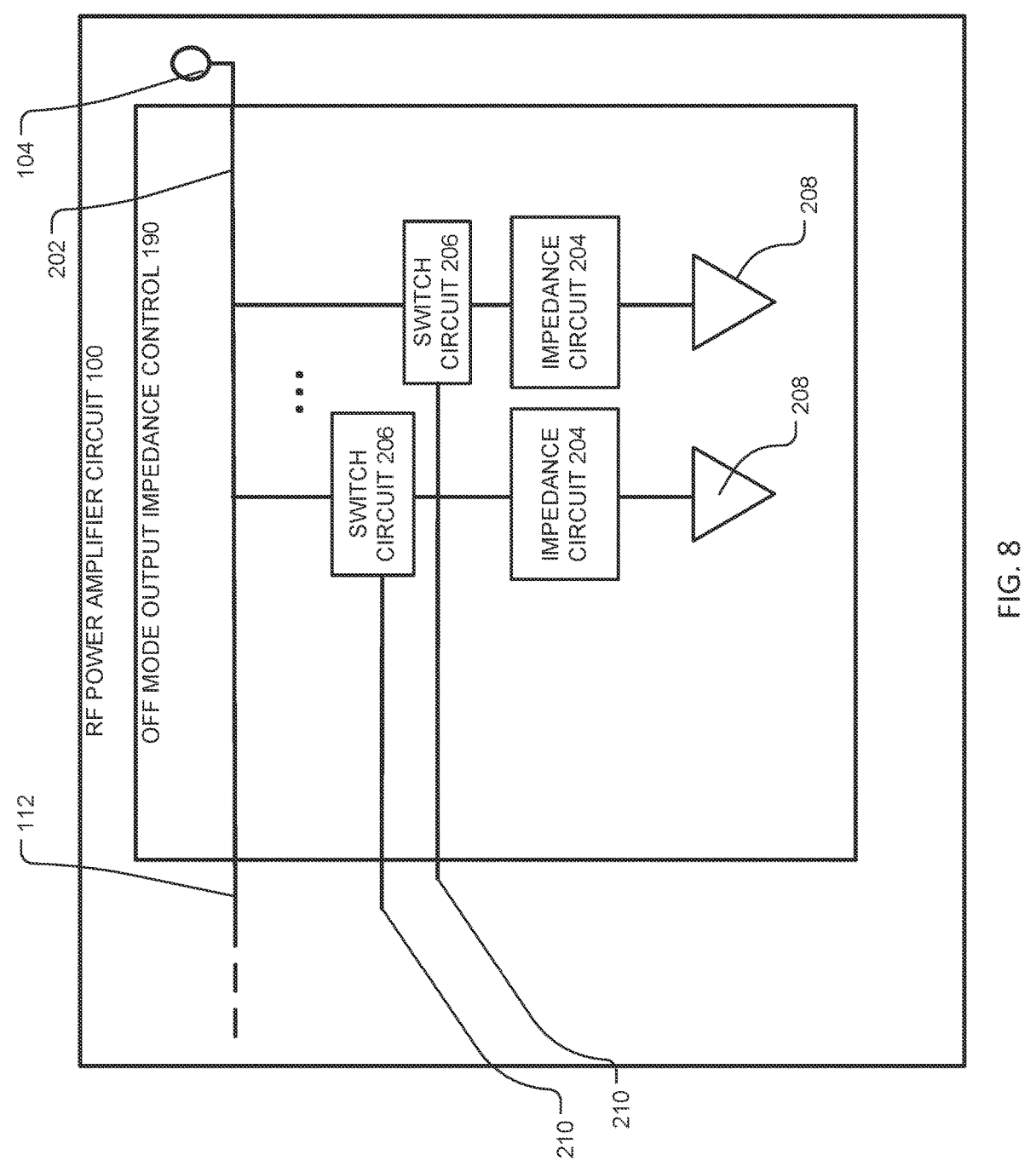

FIG. 8 illustrates an exemplary implementation of the off mode output impedance control according to aspects of the disclosure.

In particular, FIG. 8 illustrates an exemplary implementation of the off mode output impedance control 190. The aspects of FIG. 8 may include any other aspects as disclosed herein; and moreover aspects of FIG. 8 may be implemented in other aspects described herein. As illustrated in FIG. 8, the off mode output impedance control 190 may implement two or more separate implementations of the at least one switch circuit 206 and two or more separate implementations of the impedance circuit 204. The implementations of the at least one switch circuit 206 and the impedance circuit 204 are not limited to the arrangement in FIG. 8 and may be arranged and structured in accordance with other aspects as described herein. In this regard, aspects of FIG. 8 may implement different types of the impedance circuit 204. Accordingly, the RF power amplifier circuit 100 may be configured to implement one or more of the desired implementations of the impedance circuit 204 as needed. The multiplicity of impedance circuits 204 is useful, for example, to cover large or a diversity of operating bandwidths.

Figure 9:
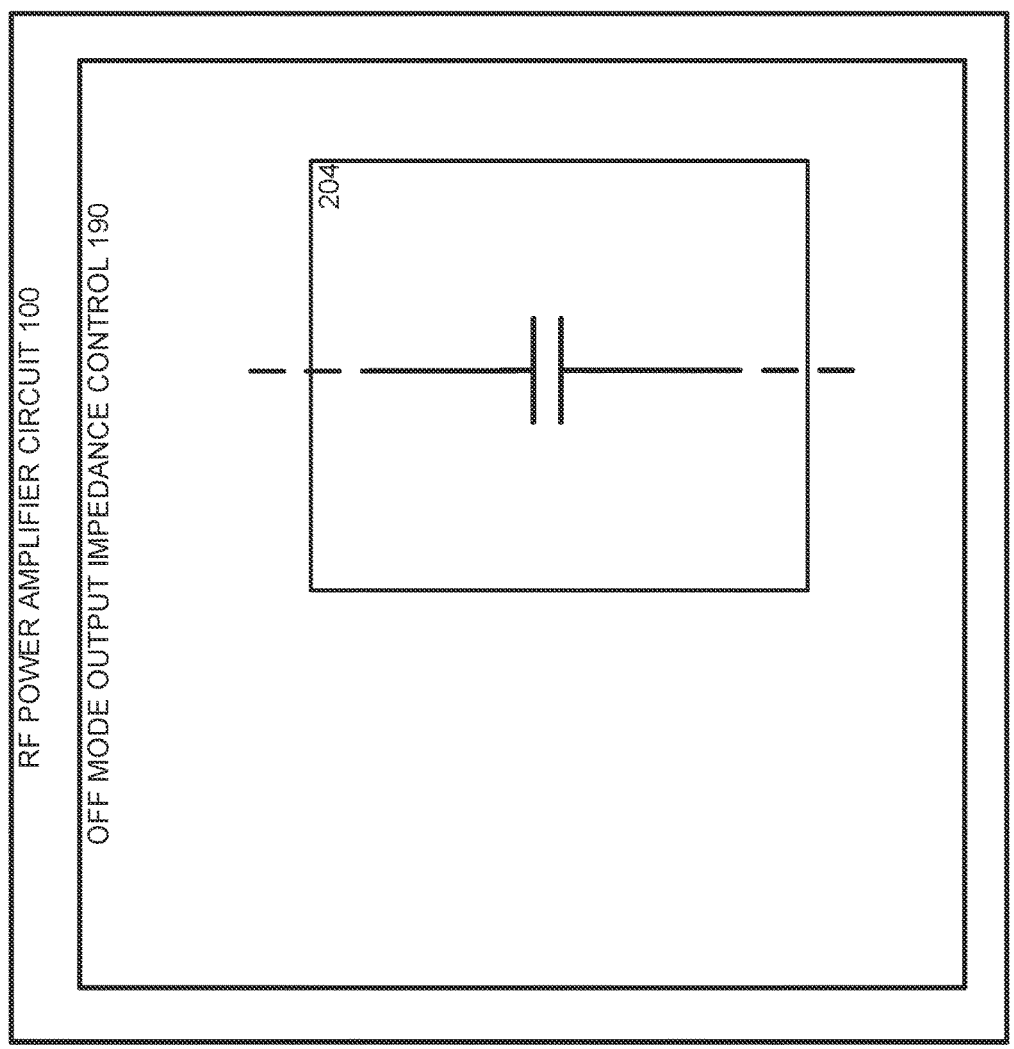
FIG. 9 illustrates an exemplary implementation of the impedance circuit in an off mode output impedance control according to aspects of the disclosure.

FIG. 9 illustrates an exemplary implementation of the impedance circuit in an off mode output impedance control according to aspects of the disclosure.

In particular, FIG. 9 illustrates an exemplary implementation of the off mode output impedance control 190. The aspects of FIG. 9 may include any other aspects as disclosed herein; and moreover aspects of FIG. 9 may be implemented in other aspects described herein. As illustrated in FIG. 9, the impedance circuit 204 may be implemented by one or more capacitors, which may be connected to the mainline 202, the impedance circuit 204, and the ground 208 as illustrated in other aspects of the disclosure.

Figure 10:
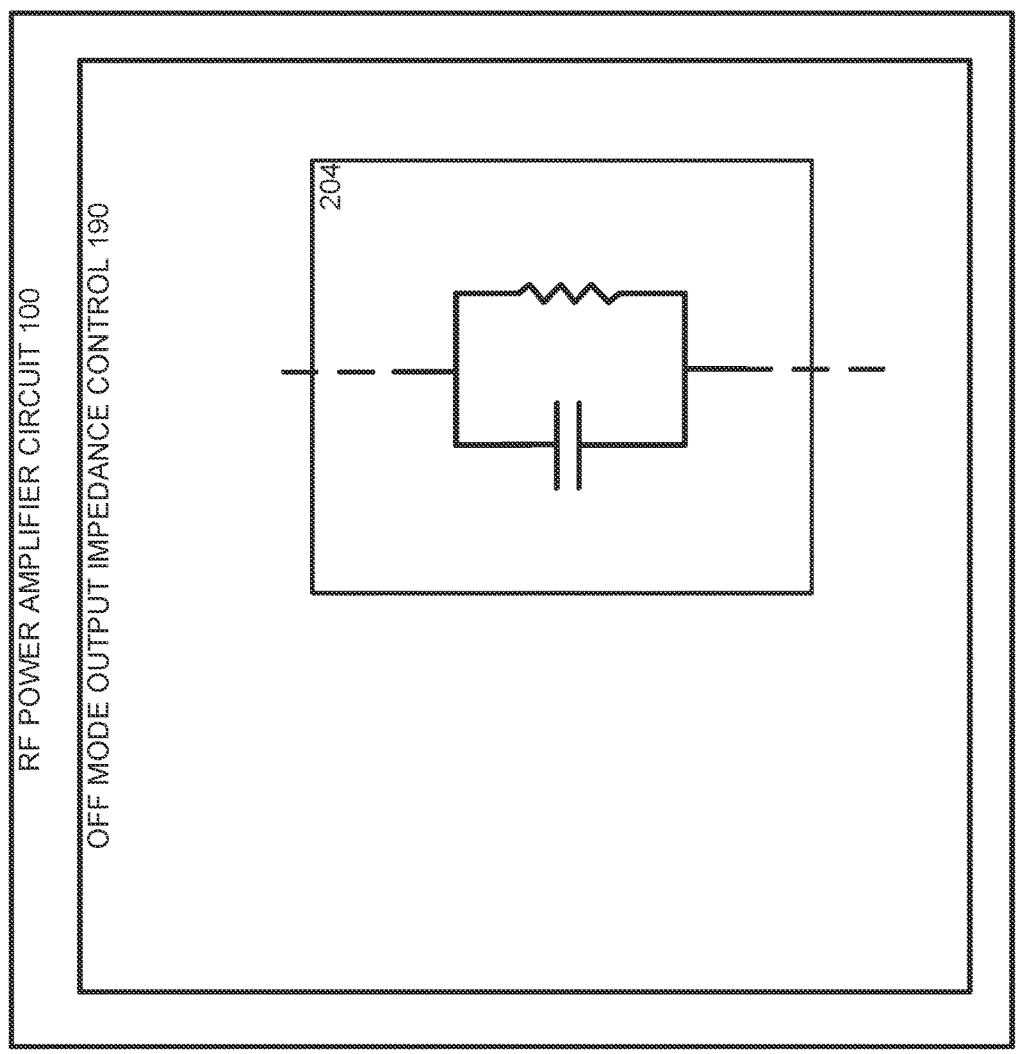
FIG. 10 illustrates an exemplary implementation of the impedance circuit in an off mode output impedance control according to aspects of the disclosure.

FIG. 10 illustrates an exemplary implementation of the impedance circuit in an off mode output impedance control according to aspects of the disclosure.

In particular, FIG. 10 illustrates an exemplary implementation of the off mode output impedance control 190. The aspects of FIG. 10 may include any other aspects as disclosed herein; and moreover aspects of FIG. 10 may be implemented in other aspects described herein. As illustrated in FIG. 10, the impedance circuit 204 may be implemented by one or more capacitors in parallel with one or more resistors, which may be connected to the mainline 202, the impedance circuit 204, and the ground 208 as illustrated in other aspects of the disclosure.

Figure 11:
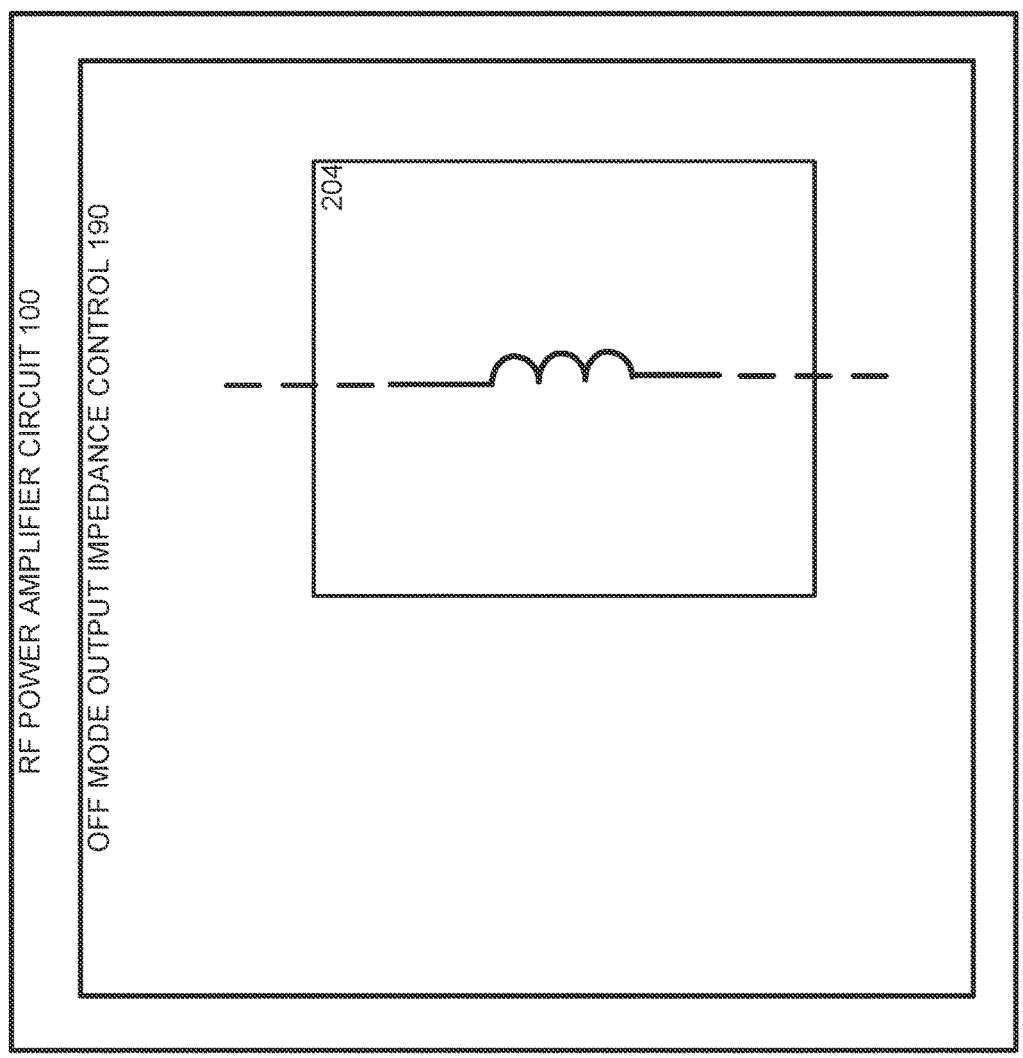
FIG. 11 illustrates an exemplary implementation of the impedance circuit in an off mode output impedance control according to aspects of the disclosure.

FIG. 11 illustrates an exemplary implementation of the impedance circuit in an off mode output impedance control according to aspects of the disclosure.

In particular, FIG. 11 illustrates an exemplary implementation of the off mode output impedance control 190. The aspects of FIG. 11 may include any other aspects as disclosed herein; and moreover aspects of FIG. 11 may be implemented in other aspects described herein. As illustrated in FIG. 11, the impedance circuit 204 may be implemented by one or more inductors, which may be connected to the mainline 202, the impedance circuit 204, and the ground 208 as illustrated in other aspects of the disclosure.

Figure 12:
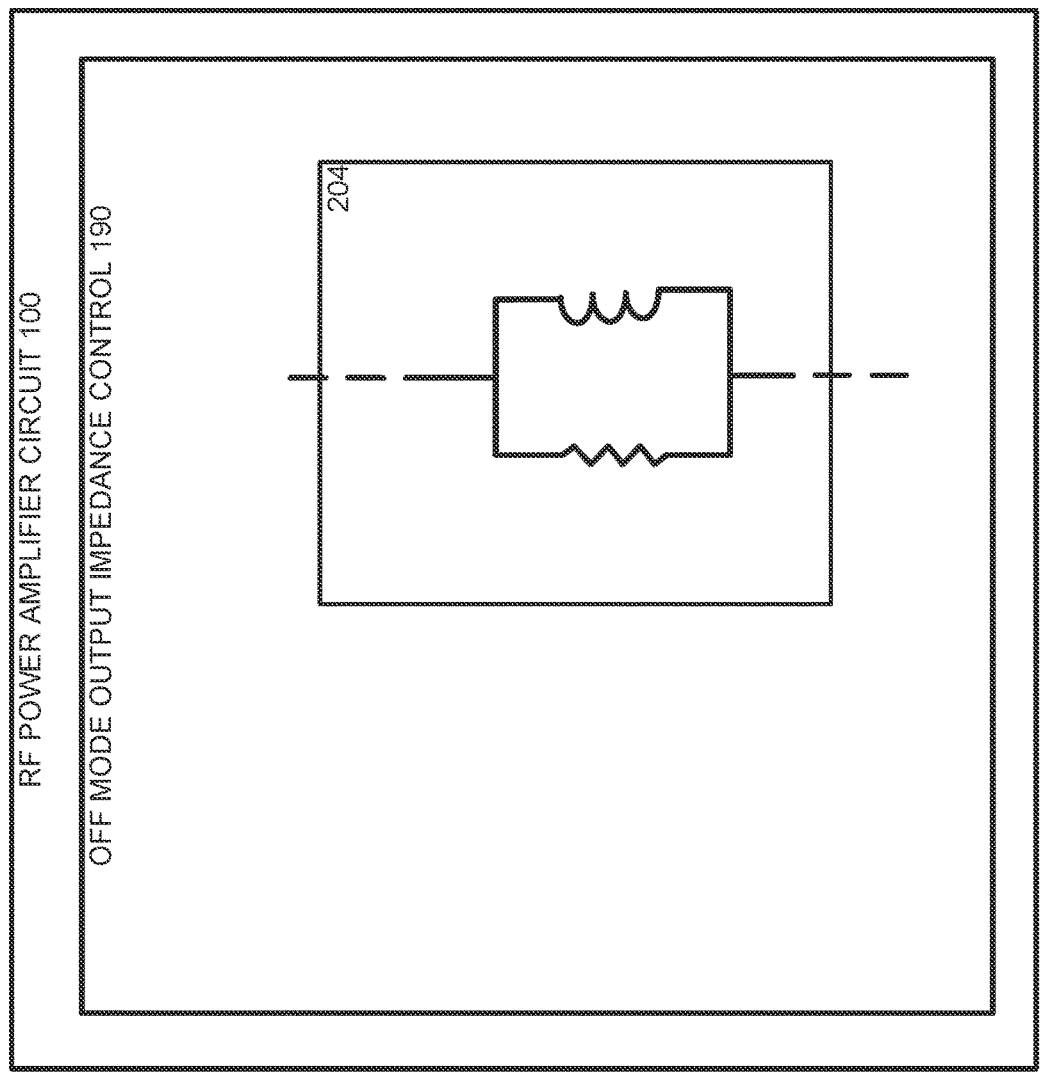
FIG. 12 illustrates an exemplary implementation of the impedance circuit in an off mode output impedance control according to aspects of the disclosure.

FIG. 12 illustrates an exemplary implementation of the impedance circuit in an off mode output impedance control according to aspects of the disclosure.

In particular, FIG. 12 illustrates an exemplary implementation of the off mode output impedance control 190. The aspects of FIG. 12 may include any other aspects as disclosed herein; and moreover aspects of FIG. 12 may be implemented in other aspects described herein. As illustrated in FIG. 12, the impedance circuit 204 may be implemented by one or more inductors in parallel with one or more resistors, which may be connected to the mainline 202, the impedance circuit 204, and the ground 208 as illustrated in other aspects of the disclosure.

Figure 13:
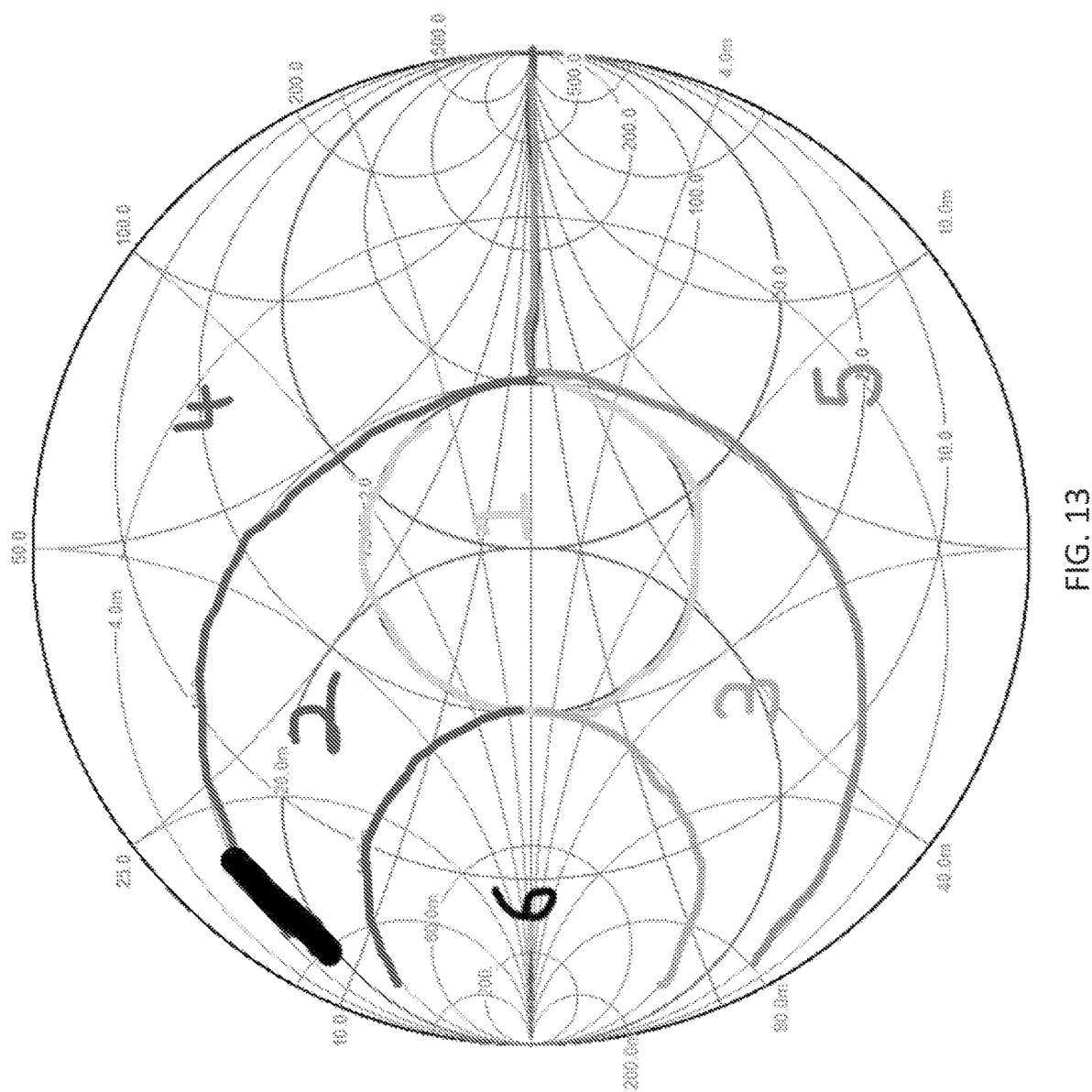
FIG. 13 illustrates various zones where the S22 parameter of a power amplifier may operate.

FIG. 13 illustrates various zones where the S22 parameter of a power amplifier may come about.

In this regard, without implementation of the off mode output impedance control 190 implemented by the RF power amplifier circuit 100, the S22 parameter of a power amplifier in off mode may stand in zone 2, zone 3, zone 6, zone 5 and/or zone 4. On the other hand, implementation of the RF power amplifier circuit 100 with the off mode output impedance control 190 provides the S22 parameter of a power amplifier in zone 1.

In aspects, where the power amplifier operates such that the S22 parameter of a power amplifier is in zone 6, the off mode output impedance control 190 may be configured for implementation of the rotation circuit 212 as illustrated in FIG. 6 and FIG. 7.

In aspects, where the power amplifier operates such that the S22 parameter of a power amplifier is in zone 2 or zone 6, the off mode output impedance control 190 may be configured for implementation of the impedance circuit 204 as illustrated in FIG. 9.

In aspects, where the power amplifier operates such that the S22 parameter of a power amplifier is in zone 4, the off mode output impedance control 190 may be configured for implementation of the impedance circuit 204 as illustrated in FIG. 10.

In aspects, where the power amplifier operates such that the S22 parameter of a power amplifier is in zone 3, the off mode output impedance control 190 may be configured for implementation of the impedance circuit 204 as illustrated in FIG. 11.

In aspects, where the power amplifier operates such that the S22 parameter of a power amplifier is in zone 5, the off mode output impedance control 190 may be configured for implementation of the impedance circuit 204 as illustrated in FIG. 12.

In aspects, where the power amplifier operates such that the S22 parameter of a power amplifier may be in one of multiple zones, the off mode output impedance control 190 may be configured for implementation of the multiple implementations of the impedance circuit 204 as illustrated in FIG. 8. Accordingly, depending on the operating zone, the desired implementation of the impedance circuit 204 may be switched on by a respective implementation of the at least one switch circuit 206 to ensure the off mode output impedance control 190 provides the desired impedance control for the RF power amplifier circuit 100.

Figure 14A:
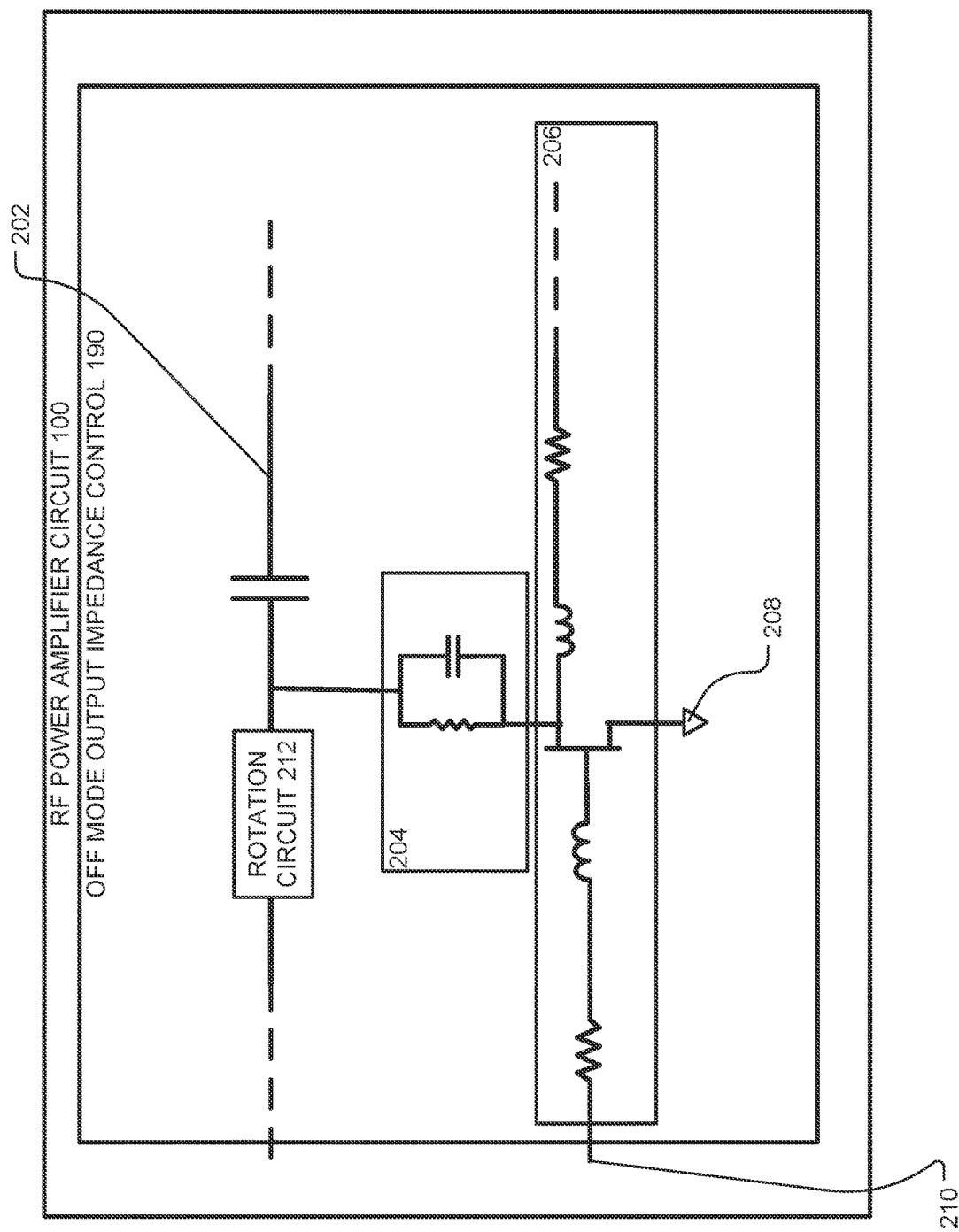
FIG. 14A illustrates an exemplary implementation of the off mode output impedance control according to aspects of the disclosure.

FIG. 14A illustrates an exemplary implementation of the off mode output impedance control according to aspects of the disclosure.

In particular, FIG. 14A illustrates an exemplary implementation of the off mode output impedance control 190. The aspects of FIG. 14A may include any other aspects as disclosed herein; and moreover aspects of FIG. 14A may be implemented in other aspects described herein. Moreover, the off mode output impedance control 190 illustrated in FIG. 14A is merely exemplary and the off mode output impedance control 190 may be implemented in numerous other ways as described herein.

As illustrated in FIG. 14A, the impedance circuit 204 may be implemented by one or more inductors or capacitors in parallel with one or more resistors, which may be connected to the mainline 202, the impedance circuit 204, and the ground 208 as illustrated in other aspects of the disclosure. The elements within the impedance circuit 204 being the required elements to bring S22 to Zone 1. Further, as shown in the at least one switch circuit 206, the switch may need either resistors and/or inductors for proper biasing of the gate and drain (those biasing elements may additionally need to be decoupled).

Further, the at least one switch circuit 206 may be implemented by a FET. However, as described herein, the switching devices implemented by the at least one switch circuit 206 may be any type of switching device; and there may be any number of switching devices implemented by the at least one switch circuit 206. Further, a gate of the switching device of the at least one switch circuit 206 is connected an inductor in combination to or instead of a resistor. These elements may be configured to receive the control input 210.

Figure 14B:
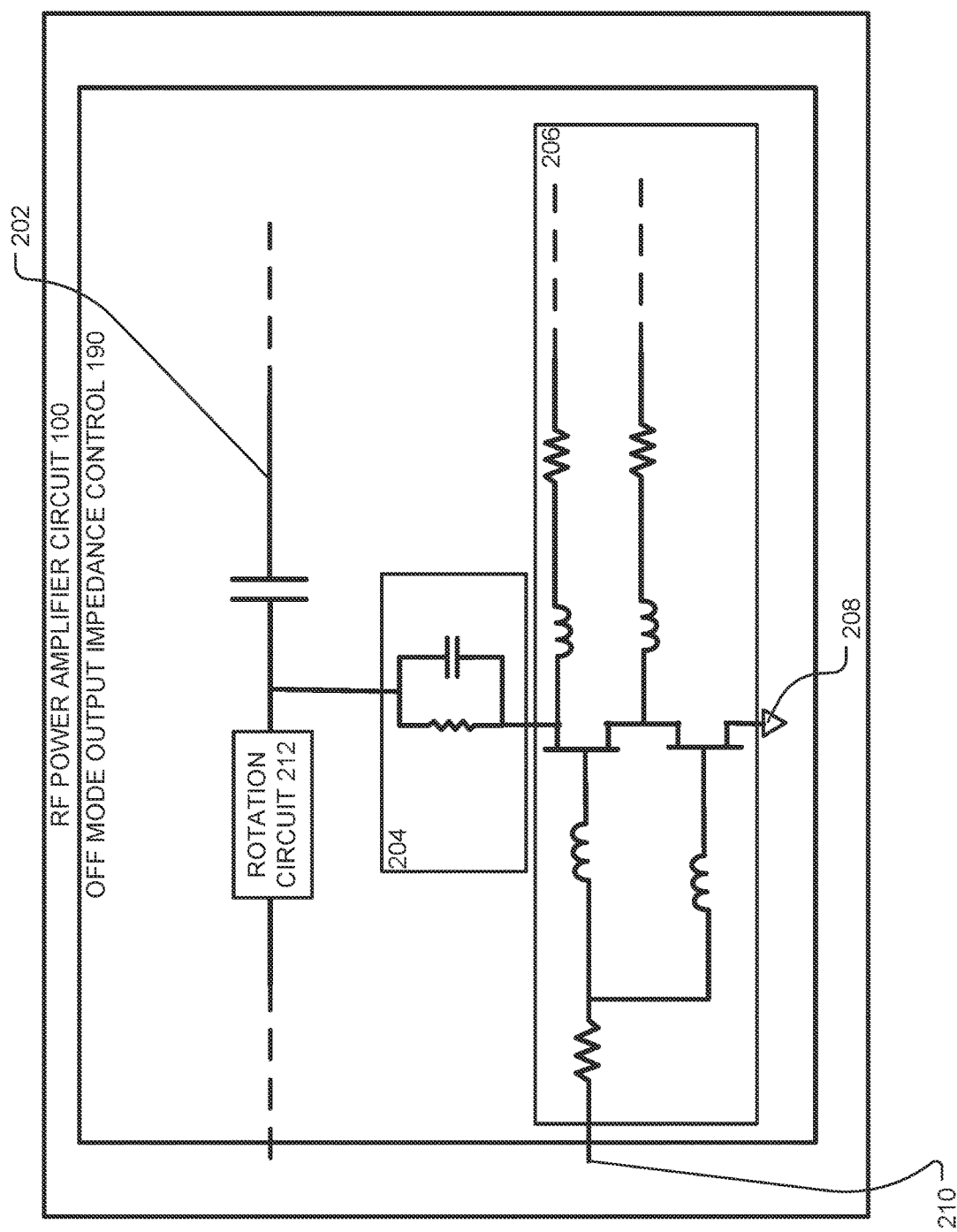
FIG. 14B illustrates an exemplary implementation of the off mode output impedance control according to aspects of the disclosure.

FIG. 14B illustrates an exemplary implementation of the off mode output impedance control according to aspects of the disclosure.

In particular, FIG. 14B illustrates an exemplary implementation of the off mode output impedance control 190. The aspects of FIG. 14B may include any other aspects as disclosed herein; and moreover aspects of FIG. 14B may be implemented in other aspects described herein. Moreover, the off mode output impedance control 190 illustrated in FIG. 14B is merely exemplary and the off mode output impedance control 190 may be implemented in numerous other ways as described herein.

As illustrated in FIG. 14B, the impedance circuit 204 may be implemented by one or more inductors or capacitors in parallel with one or more resistors, which may be connected to the mainline 202, the impedance circuit 204, and the ground 208 as illustrated in other aspects of the disclosure. Further, the one or more inductors and/or the one or more resistors may be connected to bias the exemplary FET switch at the gate and drain. One or more of those elements are usually required to bias the switch and also be decoupled. Their presence or absence being decided during the design process.

In FIG. 14B the switch 206 has been configured with two FETs connected. This configuration approximately extends to switch power operability by, theoretically, 4 times (or 6 dB). In this respect, FIG. 14B is exemplary and can further extend the power capability by multiplying for FETs. Three FETs would extend the power capability by 8 times (or 9 dB) etc.

Figure 14C:
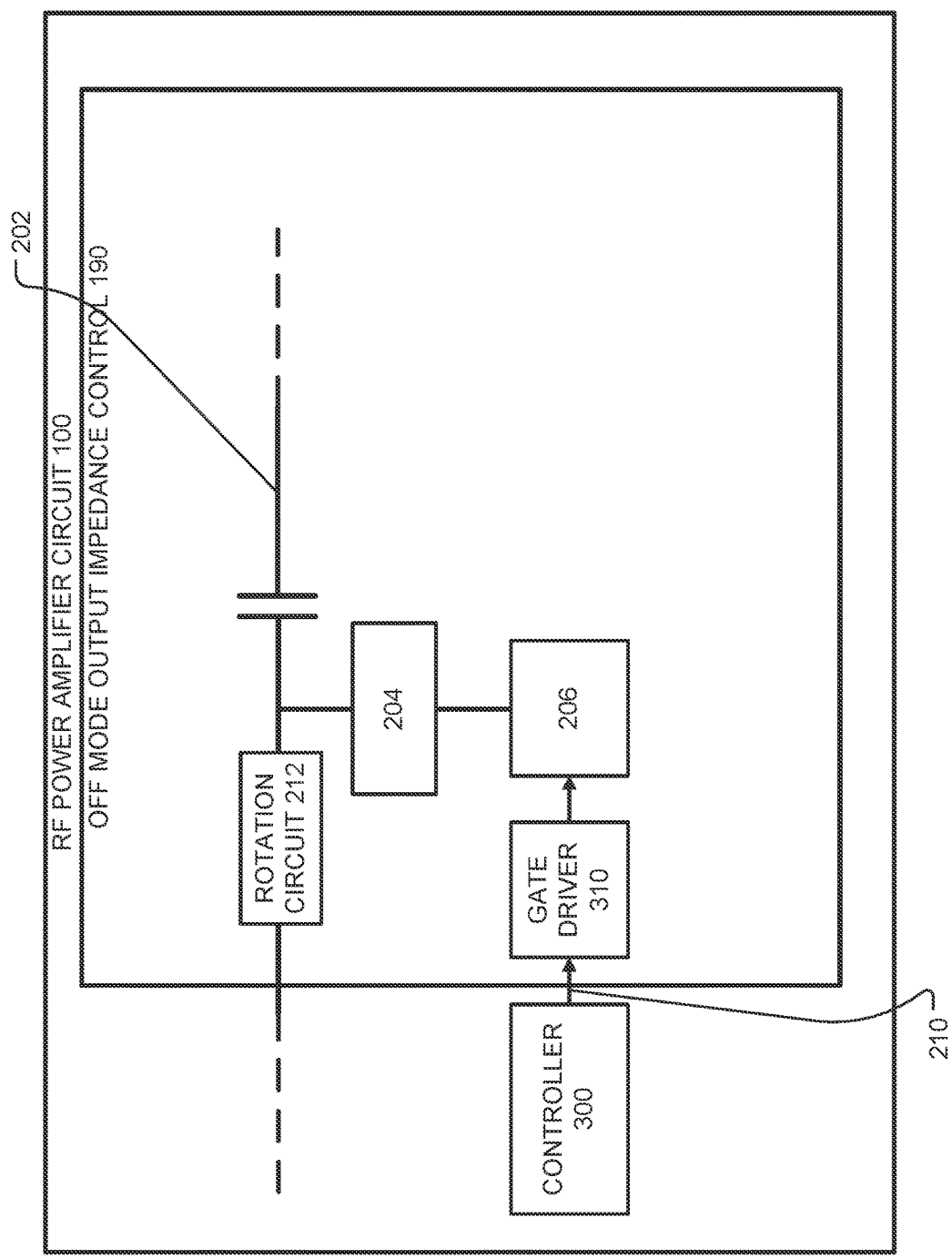
FIG. 14C illustrates an exemplary implementation of the off mode output impedance control according to aspects of the disclosure.

FIG. 14C illustrates an exemplary implementation of the off mode output impedance control according to aspects of the disclosure.

In particular, FIG. 14C illustrates an exemplary implementation of the off mode output impedance control 190. The aspects of FIG. 14C may include any other aspects as disclosed herein; and moreover aspects of FIG. 14C may be implemented in other aspects described herein. Moreover, the off mode output impedance control 190 illustrated in FIG. 14C is merely exemplary and the off mode output impedance control 190 may be implemented in numerous other ways as described herein.

As illustrated in FIG. 14C, the off mode output impedance control 190 may receive the control input 210 from a controller 300. It should be noted that the controller 300 is not necessary to implementations of the disclosure. In this regard, aspects of the controller 300 may be implemented with a simple toggled voltage. Additionally, the RF power amplifier circuit 100 and/or the off mode output impedance control 190 may include a gate driver 310. The controller 300 may generate a signal to make the off mode output impedance control 190 and/or the at least one switch circuit 206 active. The signal may be provided to the gate driver 310. Thereafter, the gate driver 310 may generate a gate drive signal and provide the gate drive signal to the at least one switch circuit 206 in order to make the at least one switch circuit 206 active. In this regard, the off mode output impedance control 190 may implement a shunt switch and match switching method. In aspects, the signal generated by the controller 300 may be 0 V or −8 V. In aspects, the gate drive signal generated by the gate driver 310 may be 0 V or −28 V. As those values are switch process dependent, they are not limiting, but merely exemplary.

Figure 14D:
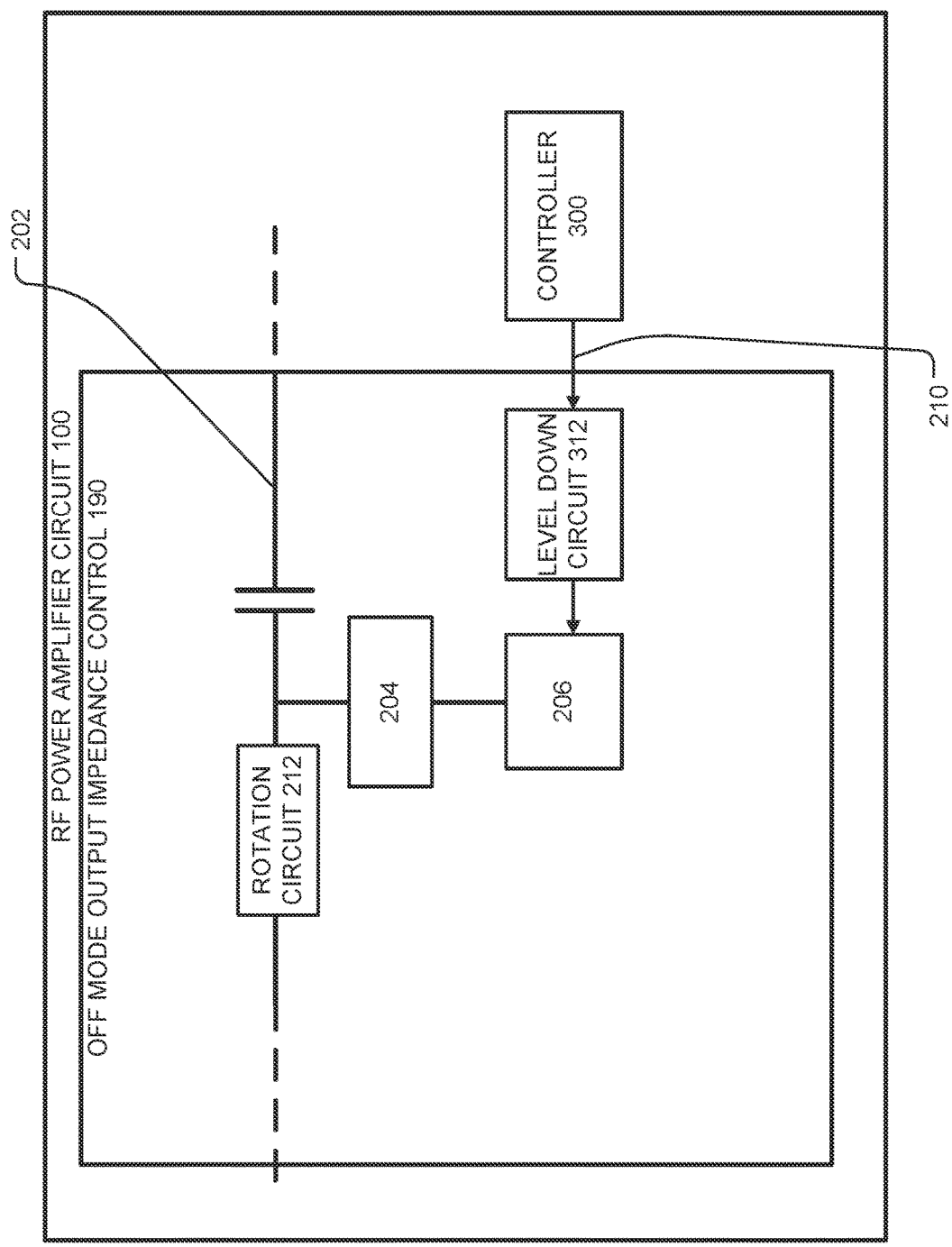
FIG. 14D illustrates an exemplary implementation of the off mode output impedance control according to aspects of the disclosure.

FIG. 14D illustrates an exemplary implementation of the off mode output impedance control according to aspects of the disclosure.

In particular, FIG. 14D illustrates an exemplary implementation of the off mode output impedance control 190. The aspects of FIG. 14D may include any other aspects as disclosed herein; and moreover aspects of FIG. 14D may be implemented in other aspects described herein. Moreover, the off mode output impedance control 190 illustrated in FIG. 14D is merely exemplary and the off mode output impedance control 190 may be implemented in numerous other ways as described herein.

As illustrated in FIG. 14D, the off mode output impedance control 190 may receive the control input 210 from a controller 300. Additionally, the RF power amplifier circuit 100 and/or the off mode output impedance control 190 may include a level down circuit 312. The controller 300 may generate a signal to make the off mode output impedance control 190 and/or the at least one switch circuit 206 active. The signal may be provided to the level down circuit 312. Thereafter, the level down circuit 312 may generate a signal and provide the signal to the at least one switch circuit 206 in order to make the at least one switch circuit 206 active. In this regard, the off mode output impedance control 190 may implement a shunt switch and match switching method. In aspects, a gate or gates of the at least one switch circuit 206 may be grounded. The level down circuit 312 may use an available source used, and therefore available, in the power amplifier section of the RF power amplifier circuit 100 (an exemplary value, for a GaN based amplifier device, is 50 V) and may not need a complex gate driver generating −28V. In aspects, the level down circuit 312 may use a MOS-or-BJT transistor. In aspects, the signal generated by the controller 300 may be 0 V or 1.8 V. In aspects, the signal generated by the level down circuit 312 may be 0 V or 28 V. In aspects, the at least one switch circuit 206 active may implement a GaN transistor switch device.

Figure 14E:
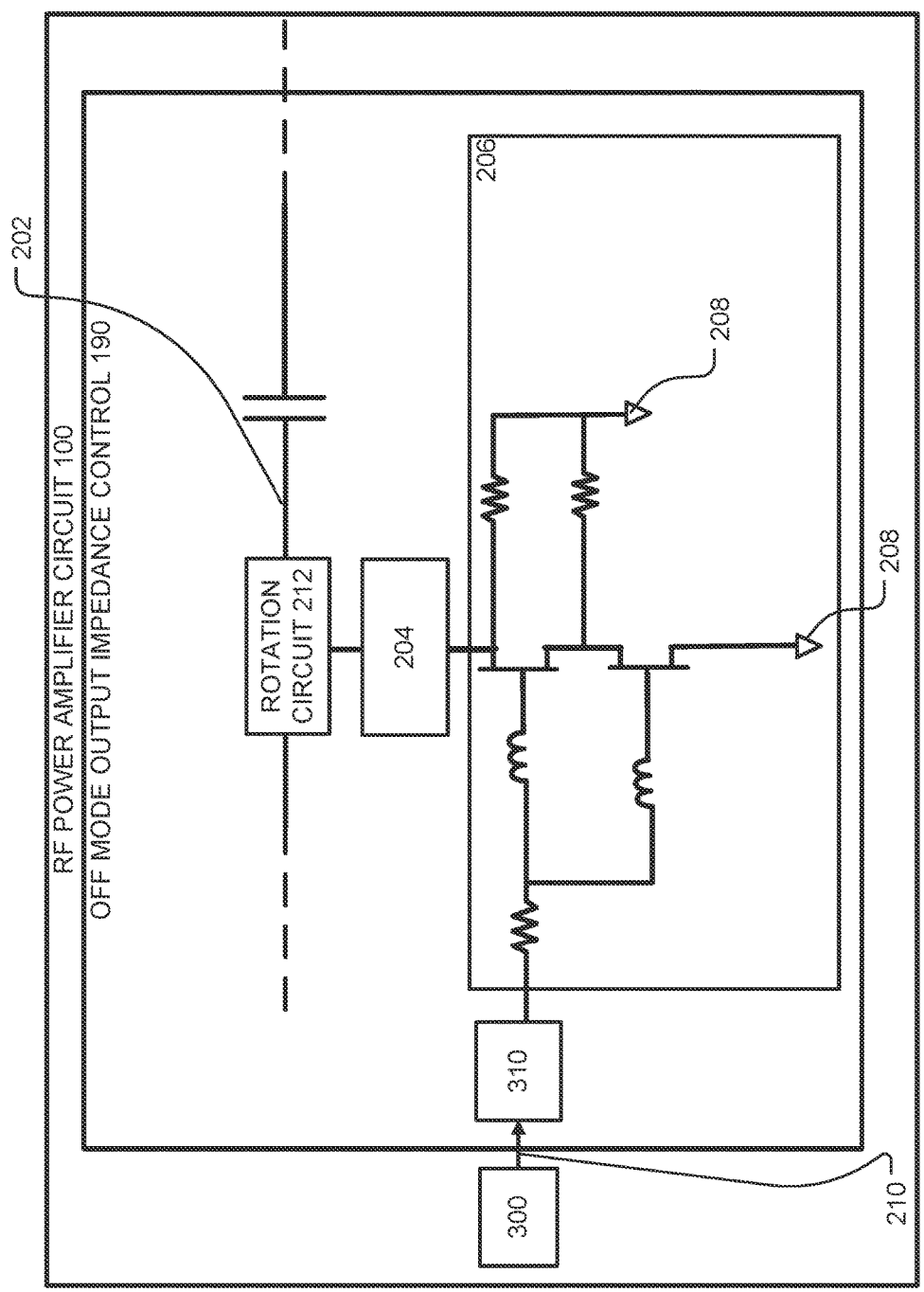
FIG. 14E illustrates an exemplary implementation of the off mode output impedance control according to aspects of the disclosure.

FIG. 14E illustrates an exemplary implementation of the off mode output impedance control according to aspects of the disclosure.

In particular, FIG. 14E illustrates an exemplary implementation of the off mode output impedance control 190. The aspects of FIG. 14E may include any other aspects as disclosed herein; and moreover aspects of FIG. 14E may be implemented in other aspects described herein. Moreover, the off mode output impedance control 190 illustrated in FIG. 14E is merely exemplary and the off mode output impedance control 190 may be implemented in numerous other ways as described herein.

As illustrated in FIG. 14E, the off mode output impedance control 190 may receive the control input 210 from the controller 300. Additionally, the RF power amplifier circuit 100 and/or the off mode output impedance control 190 may include the gate driver 310. The controller 300 may generate a signal to make the off mode output impedance control 190 and/or the at least one switch circuit 206 active. The signal may be provided to the gate driver 310. Thereafter, the gate driver 310 may generate a gate drive signal and provide the gate drive signal to the at least one switch circuit 206 in order to make the at least one switch circuit 206 active. In this regard, the off mode output impedance control 190 may implement a shunt switch and match switching method. In aspects, the signal generated by the controller 300 may be 0 V or −8 V. In aspects, the gate drive signal generated by the gate driver 310 may be 0 V or −28 V.

FIG. 14E further illustrates exemplary details of an aspect of the at least one switch circuit 206. In this regard, the gate driver 310 may be connected to the gates of the transistors of the at least one switch circuit 206. In aspects, the transistors of the at least one switch circuit 206 may be FETs. The connection between the gate driver 310 and the gates of the transistors of the at least one switch circuit 206 may include one or more resistors and one or more inductors. As illustrated in FIG. 14E, the gate driver 310 may connect to the resistor and the signal may be split into two inductors that may be connected to the gates of the transistors of the at least one switch circuit 206. In aspects, a drain of the transistors of the at least one switch circuit 206 may be connected to resistors and ground.

Figure 14F:
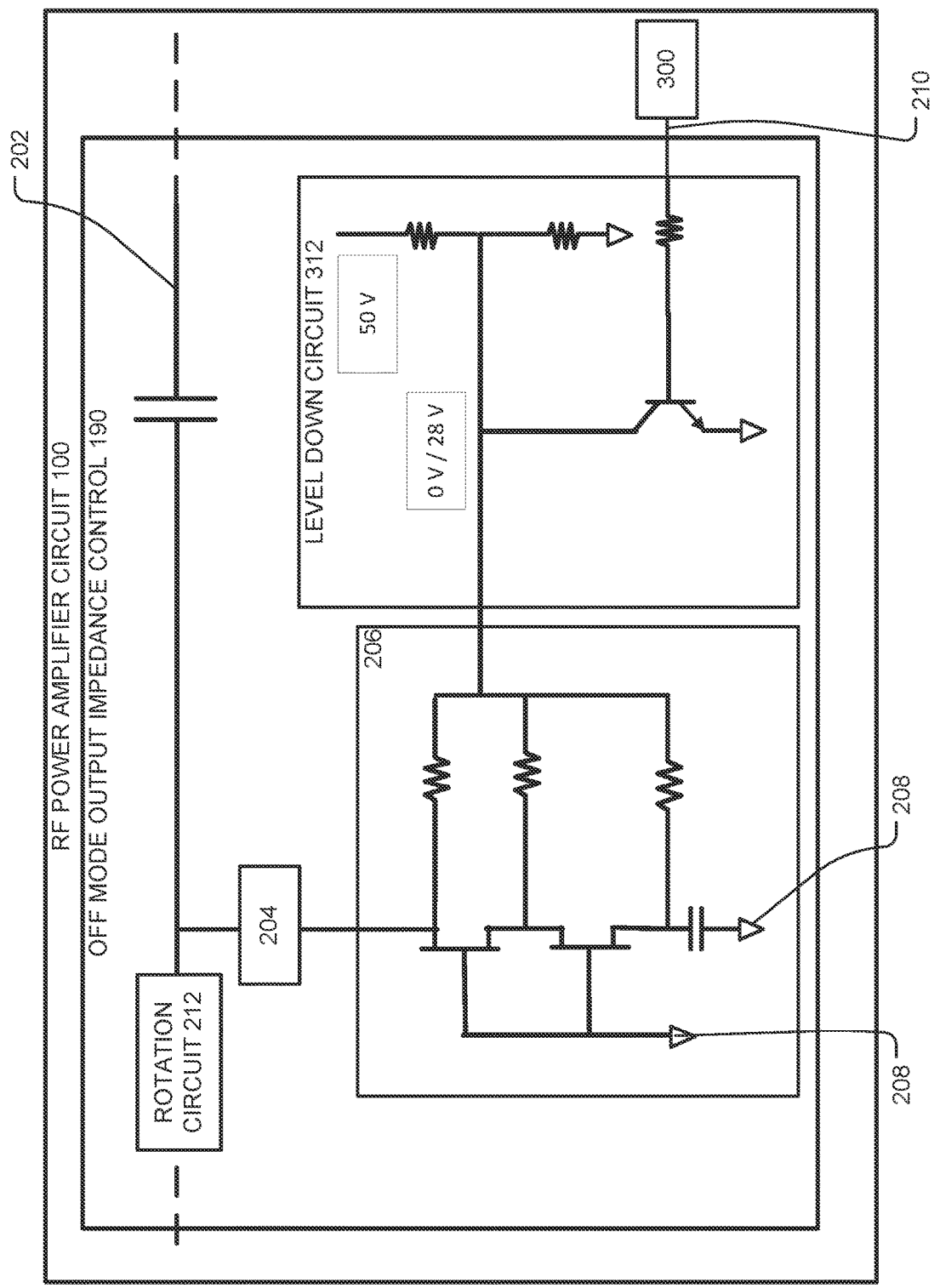
FIG. 14F illustrates an exemplary implementation of the off mode output impedance control according to aspects of the disclosure.

FIG. 14F illustrates an exemplary implementation of the off mode output impedance control according to aspects of the disclosure.

In particular, FIG. 14F illustrates an exemplary implementation of the off mode output impedance control 190. The aspects of FIG. 14F may include any other aspects as disclosed herein; and moreover aspects of FIG. 14F may be implemented in other aspects described herein. Moreover, the off mode output impedance control 190 illustrated in FIG. 14F is merely exemplary and the off mode output impedance control 190 may be implemented in numerous other ways as described herein.

As illustrated in FIG. 14F, the off mode output impedance control 190 may receive the control input 210 from the controller 300. Additionally, the RF power amplifier circuit 100 and/or the off mode output impedance control 190 may include the level down circuit 312. The controller 300 may generate a signal to make the off mode output impedance control 190 and/or the at least one switch circuit 206 active. The signal may be provided to the level down circuit 312. Thereafter, the level down circuit 312 may generate a signal and provide the signal to the at least one switch circuit 206 in order to make the at least one switch circuit 206 active. In this regard, the off mode output impedance control 190 may implement a shunt switch and match switching method. In aspects, a gate or gates of the at least one switch circuit 206 may be grounded. The level down circuit 312 may use an available 50 V source used in the power amplifier section of the RF power amplifier circuit 100 and may not need a complex gate driver generating–28V. In aspects, the level down circuit 312 may use a MOS-or-BJT transistor. In aspects, the signal generated by the controller 300 may be 0 V or 1.8 V. In aspects, the signal generated by the level down circuit 312 may be 0 V or 28 V. In aspects, the at least one switch circuit 206 active may implement a GaN transistor switch device.

FIG. 14F further illustrates exemplary details of an aspect of the at least one switch circuit 206. In aspects, gates of the transistors of the at least one switch circuit 206 may be tied to ground. In aspects, the drains of the transistors of the at least one switch circuit 206 may be tied to resistors and connected to the level down circuit 312.

In aspects, a source of the lowermost of the transistor of the at least one switch circuit 206 may also be tied to a resistor and the level down circuit 312. In particular, this resistor may be implemented as a feeding source resistor having a value that determines the power and linearity.

In aspects, a source of the lowermost of the transistor of the at least one switch circuit 206 may also be tied to a capacitor and ground. In aspects, this capacitor may allow for floating of the source. In aspects, this capacitor may be an RF short, a DC block, a matching capacitor, and/or the like.

FIG. 14F further illustrates exemplary details of an aspect of the level down circuit 312. In aspects, the level down circuit 312 may include a transistor, with the purpose of activating and deactivating the switch circuit, that may be implemented as a BJT, but may also be implemented as a CMOS device, a FET device, and/or the like. In particular, the level down circuit 312 may receive the control input 210 from the controller 300 along a line that may include a resistor and may feed the control input 210 to the base of the BJT. The BJT may be connected to the at least one switch circuit 206 as well as ground. Additionally, the level down circuit 312 may connect to a 50 V source received via a first resistor; and this resistor may be connected to a second resistor connected to ground.

Further, the at least one switch circuit 206 may be implemented by two FETs in series. This particular aspect, not always necessary, relates to increasing the power by 6 dB as described previously. However, as described herein, the switching devices implemented by the at least one switch circuit 206 may be any type of switching device; and there may be any number of switching devices implemented by the at least one switch circuit 206. The resistor at the base of the BJT may be configured to receive the control input 210, such as proper logic level from the controller 300, which may use logic levels, for example of 1.8 V, 3.3 V or 5 V.

Implementations of aspects of the off mode output impedance control 190 illustrated in FIG. 14F, in comparison to the aspects illustrated in FIG. 14E may allow use of a positive voltage to drive the at least one switch circuit 206. Accordingly, this may eliminate any negative voltage requirement from the RF power amplifier circuit 100. This may be beneficial since generating negative voltage may be cumbersome and may generate some spurious signals in the transmit chain of the RF power amplifier circuit 100. In particular, this may require implementation of DC-DC converters having LO frequencies that are involved and that may be upconverted into the system operating frequency.

Figure 22A:
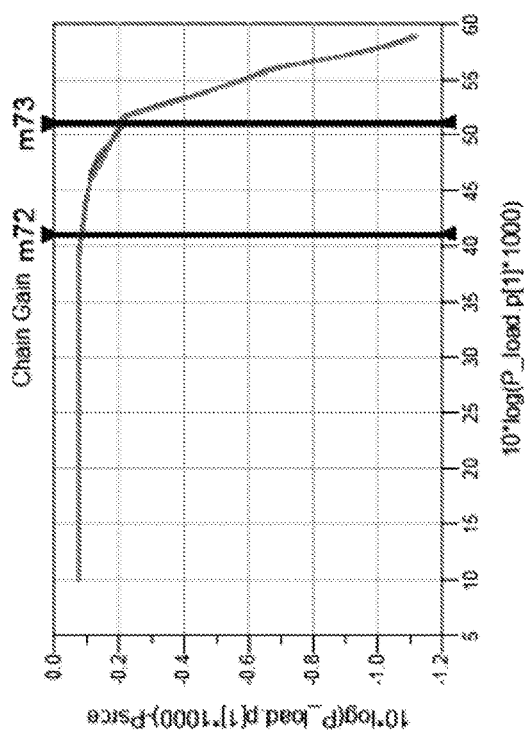
FIG. 22A illustrates a graph of power handling of the at least one switch circuit of FIG. 14E implementing off mode S22 correction according to aspects of the disclosure.
Figure 22B:
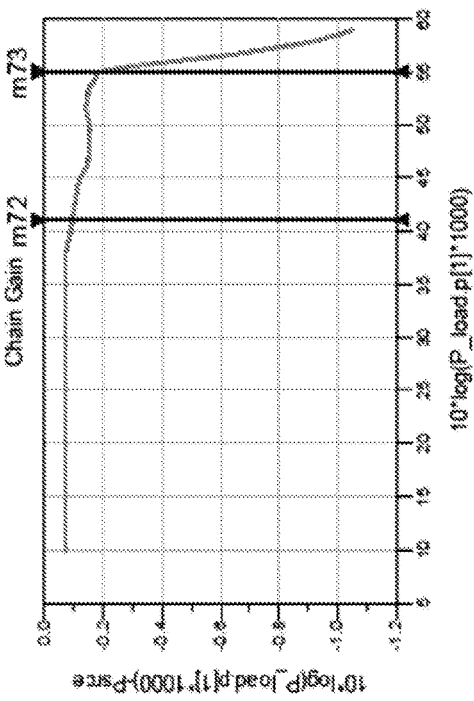
FIG. 22B illustrates a graph of power handling of the at least one switch circuit of FIG. 14F implementing off mode S22 correction according to aspects of the disclosure.

Implementations of aspects of the off mode output impedance control 190 illustrated in FIG. 14F, in comparison to the aspects illustrated in FIG. 14E may allow, by the proper choice of values of capacitor and resistors, to extend the power handling of the RF switch when Off, and the mainline 202 may provide power as shown in FIGS. 22A and 22B.

In aspects, the level down circuit 312 may have a simplified circuit structure that may be configured and used to down shift voltage, such as down shift 50 V to 28 V; and moreover, the level down circuit 312 may control the ON/OFF of the at least one switch circuit 206 using a small logic voltage of the controller 300. In aspects, the level down circuit 312 may be implemented because the at least one switch circuit 206 may operate on a 28 V rail, while the RF amplifier device 108 may operate on a 50 V rail. Accordingly, implementation of the level down circuit 312 may allow use a single voltage, such as 50 V, for the RF power amplifier circuit 100. However, the disclosure contemplates implementations where the at least one switch circuit 206 may operate on the same voltage rail as the RF amplifier device 108. Additionally, the disclosure contemplates implementations of the RF power amplifier circuit 100 having multiple voltages, such as 28 V and 50 V, and the disclosure contemplates implementations configured for operation consistent with such multiple voltage implementations with slight changes in the various circuits as described herein.

In aspects, the RF power amplifier circuit 100 may be configured as a packaged implementation of the RF power amplifier circuit 100 including a support and a housing.

In aspects, the support may be a laminate, a flange, a metal flange, a metal submount, a support, a surface, a package support, a package surface, a package support surface, a heat sink, a common source support, a common source surface, a common source package support, a common source package surface, a common source package support surface, a common source flange, a common source heat sink, a leadframe, a metal leadframe, a substrate, and/or the like. The support may include an insulating material, a dielectric material, a conductive material, a metallization, and/or the like.

The various components of the RF power amplifier circuit 100 including components of the input impedance matching network 146, components of the off mode output impedance control 190, the RF amplifier device 108, and/or the like may be implemented as one or more discrete components, surface mount device (SMD) components, integrated passive device (IPD) components, a Monolithic Microwave Integrated Circuit (MMIC) component, and/or the like. In aspects, one or more of the various components of the RF power amplifier circuit 100 including components of the input impedance matching network 146, components of the off mode output impedance control 190, the RF amplifier device 108, and/or the like may be a surface mount device (SMD) component, a surface mount device (SMD) capacitor, a ceramic capacitor, a surface mount device (SMD) ceramic capacitor, an inductor, a surface mount device (SMD) inductor, a resistor, a surface mount device (SMD) resistor, and/or the like. One or more of the various components of the RF power amplifier circuit 100 including components of the input impedance matching network 146, components of the off mode output impedance control 190, the RF amplifier device 108, and/or the like may be mounted to the support directly or may be mounted to the support with intervening structures. In aspects, the one or more of the various components of the RF power amplifier circuit 100 including components of the input impedance matching network 146, the output impedance matching network 147, components of the off mode output impedance control 190, the RF amplifier device 108, and/or the like may be mounted to the support by an adhesive, soldering, sintering, eutectic bonding, ultrasonic welding, a clip component, and/or the like as described herein.

Generally speaking, the term IPD refers to an integrated circuit, which may be semiconductor based, and includes a number of passive devices integrally formed within and connected to the terminals of the IC. A custom circuit topology can be provided by an IPD. A variety of different structures are fabricated within the device to provide the necessary frequency response of a specified passive component (e.g., capacitor, inductor, etc.). Examples of these structures include parallel plate capacitors, radial stubs, transmission lines, etc.

Additionally, one or more of the various components of the RF power amplifier circuit 100 including components of the input impedance matching network 146, the output impedance matching network 147, components of the off mode output impedance control 190, the RF amplifier device 108, and/or the like may be connected with one or more interconnects by an adhesive, soldering, sintering, eutectic bonding, ultrasonic welding, a clip component, and/or the like as described herein. The one or more interconnects may be implemented as one or more wires, wire bonds, leads, vias, edge platings, circuit traces, tracks, clips, and/or the like. In one aspect, the one or more interconnects may utilize the same type of connection. In one aspect, the one or more interconnects may utilize different types of connections.

In aspects, the housing of the packaged implementation may include an over-mold configuration. The over-mold configuration may substantially surround the RF amplifier device 108, which may be mounted on the support. The over-mold configuration may be formed of a plastic or a plastic polymer compound, which may be injection molded around the support, the off mode output impedance control 190, the RF amplifier device 108, the input impedance matching network 146, the output impedance matching network 147 and/or the like thereby providing protection from the outside environment.

The packaged implementation may include electrically conductive input leads or pads that may be located on a first side of the packaged implementation, and electrically conductive output leads or pads that may be located on a second side of the packaged implementation in an opposite direction as the electrically conductive input leads or pads. The electrically conductive input leads or pads may provide and/or implement the input port 102 of the RF power amplifier circuit 100 as described herein; and the electrically conductive output leads or pads may provide and/or implement the RF output port 104 of the RF power amplifier circuit 100 as described herein. In one aspect, the packaged implementation may be implemented to include an independent implementation of the DC bias leads or pads be located on sides of the packaged implementation adjacent to the electrically conductive output leads or pads.

The packaged implementation may be implemented with an electrically insulating window frame implementation of the housing. The electrically insulating window frame may be formed around a perimeter of the support. The electrically insulating window frame may insulate the electrically conductive input leads and the electrically conductive output leads from the support. A central portion of the housing may be exposed from the insulating window frame. This exposed portion of the housing may provide an electrically conductive die pad for one or more components of the RF power amplifier circuit 100 thereon.

The packaged implementation may implement the housing to include an open cavity configuration suitable for use with the RF amplifier device 108, the input impedance matching network 146, and/or the off mode output impedance control 190 of the disclosure. In particular, the open cavity configuration may utilize an open cavity package design. In some aspects, the open cavity configuration may include a lid or other enclosure for protecting interconnects, circuit components, the RF amplifier device 108, the input impedance matching network 146, the output impedance matching network 147, the off mode output impedance control 190, and/or the like. The packaged implementation may include a ceramic body and/or the lid may be made from a ceramic material. In one aspect, the ceramic material may include aluminum oxide ($Al_2O_3$). In one aspect, the lid may be attached to the electrically insulating window frame with an adhesive. In one aspect, the adhesive may be epoxy based.

Inside the packaged implementation, the RF amplifier device 108, the input impedance matching network 146, the output impedance matching network 147, and/or the off mode output impedance control 190 may be attached to the support via a die attach material. The electrically insulating window frame may be configured to isolate a source, a gate, and a drain of the RF amplifier device 108. The electrically insulating window frame may be configured to be more cost effective, provide better coefficient of thermal expansion (CTE) matching with the metal flange, and enable high flexibility in lead configurations for both straight lead and surface mount configurations. The electrically insulating window frame may also be configured to be rigid and therefore more stable and not susceptible to bending.

The packaged implementation may include traces, such as traces etched from copper sheets laminated, embedded, and/or otherwise attached to the support. The housing may be attached to an outer peripheral region of the support. The support may dissipate the heat generated by the RF amplifier device 108, the input impedance matching network 146, the output impedance matching network 147, and/or the off mode output impedance control 190.

In various aspects, the RF amplifier device 108 and the RF power amplifier circuit 100 may be a 5G amplifier, a multi-carrier amplifier, a multiband amplifier, an LTE (long term evolution) compliant amplifier, a WCDMA (wideband code division multiple access) compliant amplifier, an 802.11(x) compliant amplifier, and/or the like. The RF power amplifier circuit 100 may be utilized in or with a base station, a wireless device, a cellular base station communication transmitter, a cellular base station communication amplifier, a RF power amplifier for various cellular bands, a wireless fidelity (Wi-Fi) device, a multiple-input and multiple-output (MIMO) device, a device utilizing IEEE 802.11n (Wi-Fi), device utilizing IEEE 802.11ac (Wi-Fi), a device implementing Evolved High Speed Packet Access (HSPA+) protocol, a device implementing 3G protocol, a device implementing Worldwide Interoperability for Microwave Access (WiMAX) protocol, a device implementing 4G protocol, a device implementing Long Term Evolution (LTE) protocol, a device implementing 5G protocol, a device used in a IOT (Internet Of Things) system, a class-A amplifier device, a class-B amplifier device, a class-C amplifier device, a class-AB amplifier device, a Doherty amplifier, and/or the like, and combinations thereof.

Generally speaking, the RF amplifier device 108 may be any device that can perform amplification of a RF signal. In the depicted aspect, the RF amplifier device 108 is a transistor device, wherein the input terminal 110 corresponds to a control terminal or gate terminal of the transistor device, the output terminal 112 corresponds to a first load terminal, such as a drain, of the transistor device, and the reference potential terminal 114 corresponds to a second load terminal, such as a source terminal, of the transistor device.

The RF amplifier device 108 may be configured to amplify a RF signal across a RF frequency range between the input terminal 110 and the output terminal 112 across a RF frequency range that includes a fundamental RF frequency. According to an aspect, this frequency range may be a "wideband" frequency range. A "wideband" frequency range refers to the fact that the range of frequency values for the RF signal exceeds a coherence bandwidth of a single channel.

In one aspect, the packaged implementation may contain and/or implement two of the RF power amplifier circuit 100 described herein arranged adjacent to one another. In another aspect, the packaged RF amplifier may contain and/or implement one of the RF power amplifier circuit 100.

In particular, the packaged RF amplifier may be implemented at least in part as a Doherty circuit having one of the RF power amplifier circuit 100 implemented as a carrier amplifier and another one of the RF power amplifier circuit 100 implemented as a peaking amplifier. In particular, the packaged RF amplifier may include the carrier amplifier and the peaking amplifier configured such that the packaged RF amplifier power-combines outputs of the carrier amplifier and the peaking amplifier. In one aspect, the two amplifiers may be biased differently. In one aspect, the carrier amplifier may operate at a normal Class AB or Class B. In one aspect, the peaking amplifier may operate at Class C. Other operating classes are contemplated as well.

Figure 15:
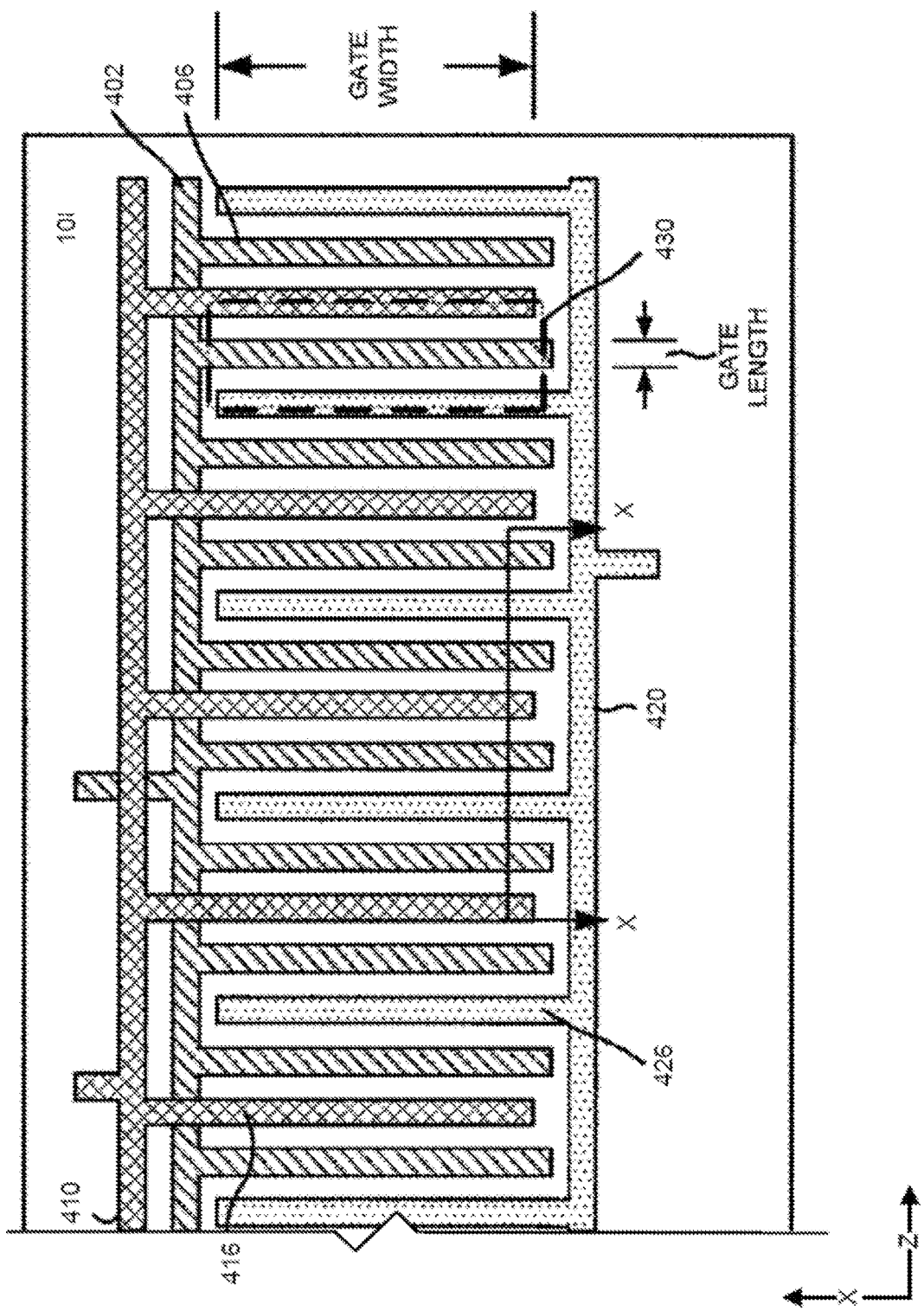
FIG. 15 is an enlarged partial layout view of an exemplary implementation of the RF amplifying transistor device according to the disclosure.

FIG. 15 is an enlarged partial layout view of an exemplary implementation of the RF amplifying transistor device according to the disclosure.

Figure 16:
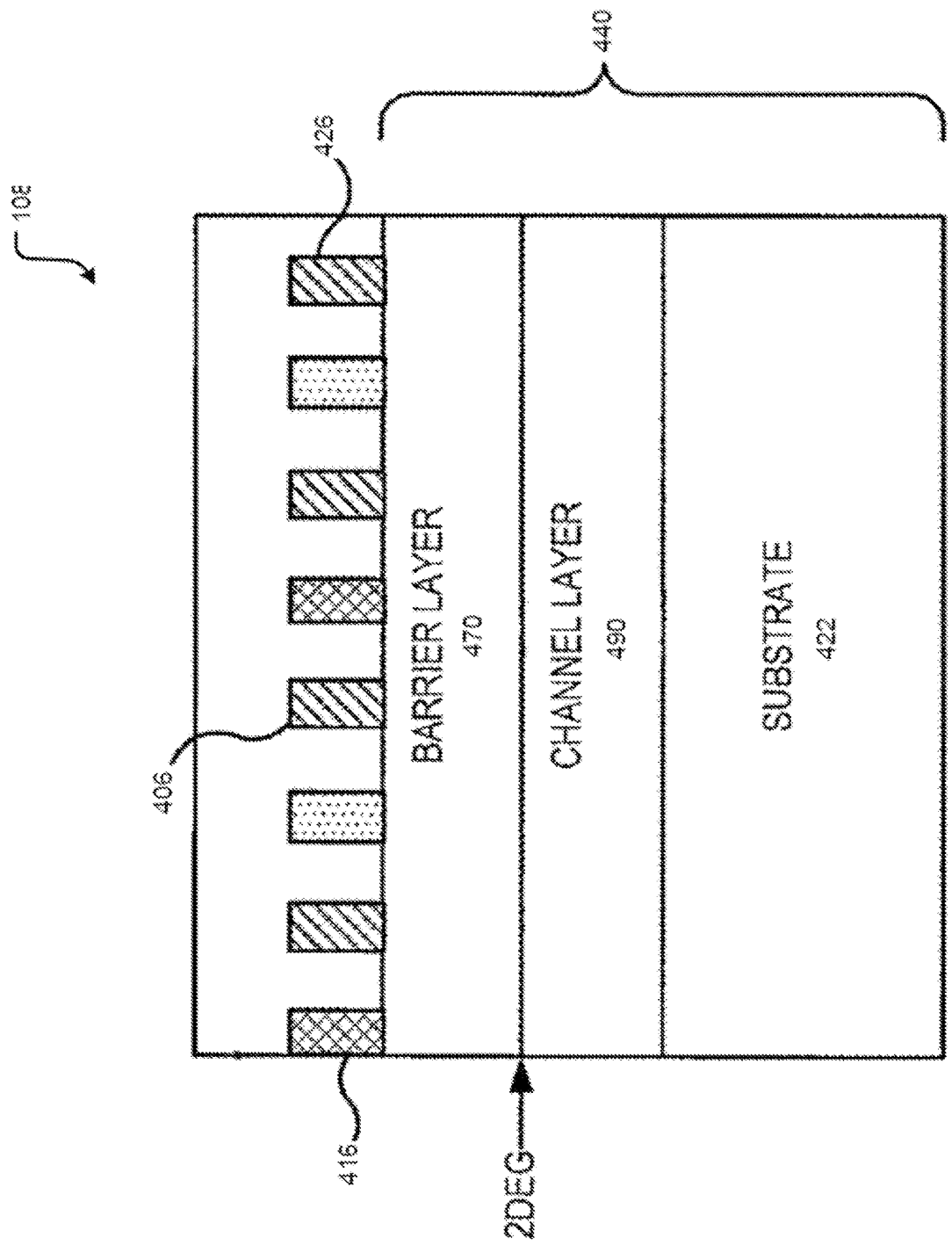
FIG. 16 is a schematic cross-sectional view taken along line X-X of FIG. 15.

FIG. 16 is a schematic cross-sectional view taken along line X-X of FIG. 15.

In particular, the aspects of FIG. 15 and FIG. 16 and the description thereof may be implemented in any other aspects and/or figures of the RF power amplifier circuit 100 as described herein. As shown in FIG. 15, the RF amplifier device 108 may include a gate bus 402 that may be connected to a plurality of gate fingers 406 that may extend in parallel in a first direction (e.g., the x-direction indicated in FIG. 15). A source bus 410 may be connected to a plurality of parallel ones of the source contacts 416. The source bus 410 may be connected to a ground voltage node on the underside of the RF amplifier device 108. A drain bus 420 may be connected to a plurality of drain contacts 426.

As can be seen in FIG. 15, each gate finger 406 may run along the X-direction between a pair of adjacent ones of the source contact 416 and drain contact 426. The RF amplifier device 108 or the RF amplifier device 108 may include a plurality of unit cells 430, where each one of the plurality of unit cells 430 may include an individual transistor. One of the plurality of unit cells 430 is illustrated by the dashed Box in FIG. 15, and includes a gate finger 406 that may extend between adjacent ones of the source contact 416 and the drain contact 426. The a "gate width" may refer to the distance by which the gate finger 406 overlaps with its associated one of the source contact 416 and drain contact 426 in the X-direction. That is, "width" of a gate finger 406 refers to the dimension of the gate finger 406 that extends in parallel to the adjacent source contact 416/drain contact 426 (the distance along the z-direction). Each of the plurality of unit cells 430 may share one of the source contact 416 and/or a drain contact 426 with one or more adjacent ones of the plurality of unit cells 430. Although a particular number of the of the plurality of unit cells 430 is illustrated in FIG. 15, it will be appreciated that the RF amplifier device 108 may include more or less of the plurality of unit cells 430.

Referring to FIG. 16, the RF amplifier device 108 may include a semiconductor structure 440 that includes a substrate 422, which may, for example, include 4H—SiC or 6H—SiC. A channel layer 490 may be arranged on the substrate 422, and a barrier layer 470 may be arranged on the channel layer 490 so that the channel layer 490 is between the substrate 422 and the barrier layer 470. The channel layer 490 and the barrier layer 470 may include Group III-nitride based materials, with the material of the barrier layer 470 having a higher bandgap than the material of the channel layer 490. For example, the channel layer 490 may include GaN, while the barrier layer 470 may comprise AlGaN.

Due to the difference in bandgap between the barrier layer 470 and the channel layer 490 and piezoelectric effects at the interface between the barrier layer 470 and the channel layer 490, a two-dimensional electron gas (2DEG) is induced in the channel layer 490 at a junction between the channel layer 490 and the barrier layer 470. The 2DEG acts as a highly conductive layer that allows conduction between the source and drain regions of the device that may be beneath a source contact 416 and a drain contact 426, respectively. The source contact 416 and the drain contact 426 may be on the barrier layer 470. Gate fingers 406 may be on the barrier layer 470 between the source contacts 416 and the drain contacts 426. While the gate fingers 406 and the source contact 416 and the drain contacts 426 are all shown as having the same "length" in FIG. 15, it will be appreciated that in practice the gate fingers 406 may have lengths that are substantially smaller than the lengths of the source contacts 416 and the drain contacts 426, and it will also be appreciated that the source contacts 416 and the drain contacts 426 need not have the same lengths.

The material of the gate finger 406 may be chosen based on the composition of the barrier layer 470. However, in certain embodiments, materials capable of making a Schottky contact to a nitride based semiconductor material may be used, such as Ni, Pt, $NiSi_x$, Cu, Pd, Cr, W and/or WSiN. The source contacts 416 and drain contacts 426 may include a metal, such as TiAlN, that can form an ohmic contact to GaN.

The RF amplifier device 108 may include a metallization layer located on a lower surface of the substrate 422. The metallization layer may be located in a plane generally parallel to the z-axis and/or the x-axis. In one aspect, the metallization layer may be implemented as a full face metallic layer on the lower surface of the substrate 422. The RF amplifier device 108 may include separate conducting lines, tracks, circuit traces, pads for connections, vias to pass connections between layers of aluminum, copper, silver, gold, and/or the like, and features such as solid conductive areas for EM shielding or other purposes.

Figure 17:
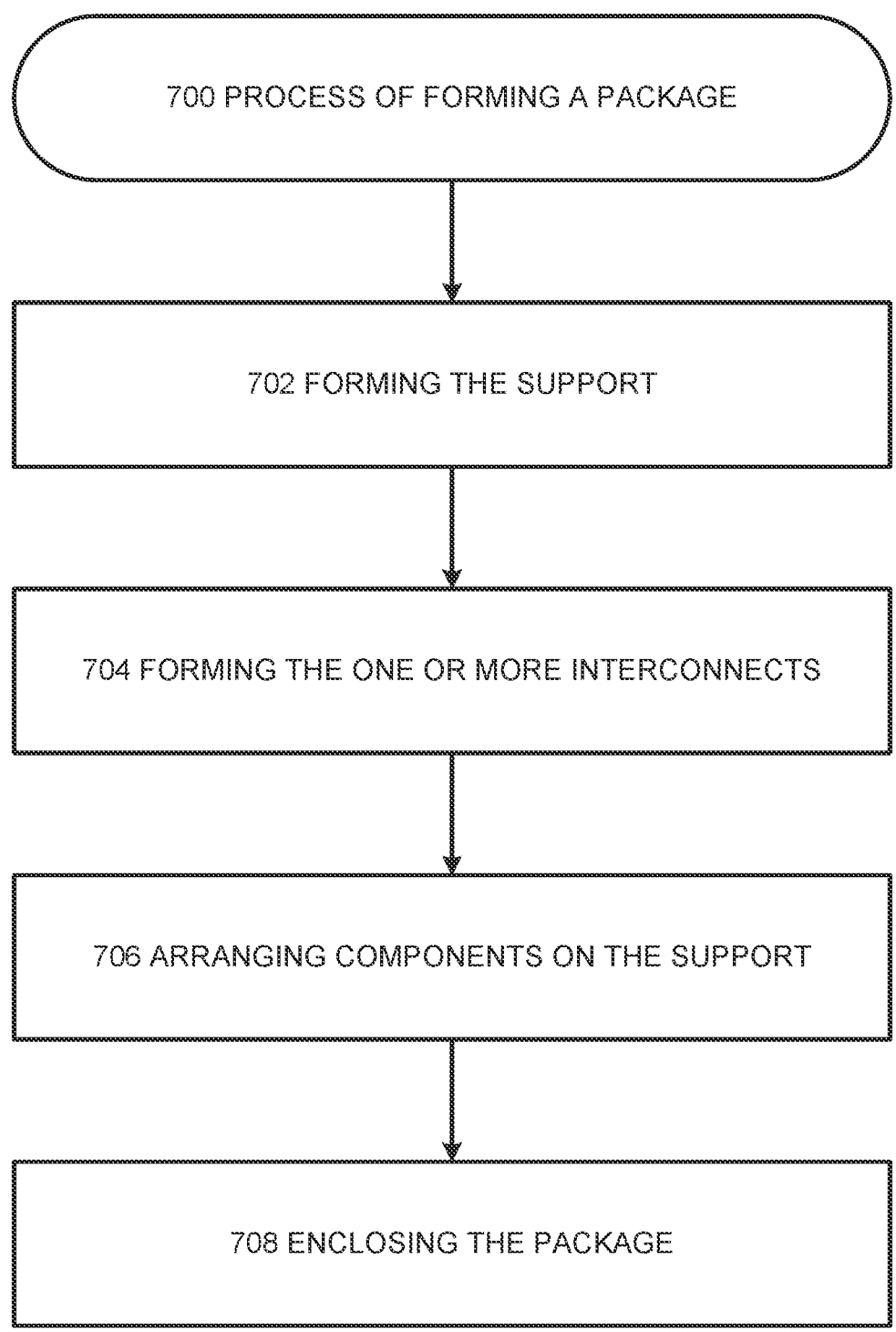
FIG. 17 illustrates a process of implementing a package according to the disclosure.

FIG. 17 illustrates a process of implementing a package according to the disclosure.

The process illustrated in FIG. 17 and described below may include any one or more other features, components, arrangements, and/or the like as described herein. In particular, FIG. 17 illustrates a process of forming a package 700 that relates to the packaged implementation as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein.

Initially, the process of forming a package 700 may include a process of forming the support 702. More specifically, the support may be constructed, configured, and/or arranged as described herein. In aspects, the support may be a laminate, a flange, a metal flange, a metal submount, a support, a surface, a package support, a package surface, a package support surface, a heat sink, a common source support, a common source surface, a common source package support, a common source package surface, a common source package support surface, a common source flange, a common source heat sink, a leadframe, a metal leadframe, a substrate, and/or the like. The support may include an insulating material, a dielectric material, a conductive material, a metallization, and/or the like.

The process of forming a package 700 may include a process of forming the one or more interconnects 704. More specifically, the one or more interconnects may be constructed, configured, and/or arranged as described herein. In one aspect, the process of forming the one or more interconnects 704 may include forming the one or more interconnects by forming one or more wires, leads, vias, edge platings, circuit traces, tracks, and/or the like on the support and/or between and to the components of the RF power amplifier circuit 100 including the RF amplifier device 108, the input impedance matching network 146, and/or the off mode output impedance control 190.

The process of forming a package 700 may include a process of arranging components on the support 706. More specifically, the process of arranging components on the support 706 may include arranging components of the RF power amplifier circuit 100 including the RF amplifier device 108, the input impedance matching network 146, and/or the off mode output impedance control 190 on the support as described herein. Thereafter, the process of arranging components on the support 706 may further include attaching the components of the RF power amplifier circuit 100 including the RF amplifier device 108, the input impedance matching network 146, and/or the off mode output impedance control 190 to the support. In this regard, the components of the RF power amplifier circuit 100 may be mounted on the upper surface of the support by an adhesive, soldering, sintering, eutectic bonding, ultrasonically welding, and/or the like as described herein.

The process of forming a package 700 may include a process of enclosing the package 708. More specifically, the packaged implementation may be constructed, configured, and/or arranged as described herein. In aspects, the housing of the packaged implementation may include an over-mold configuration, an electrically insulating window frame implementation of the housing, the housing may include an open cavity configuration, and/or the like.

Figure 18:
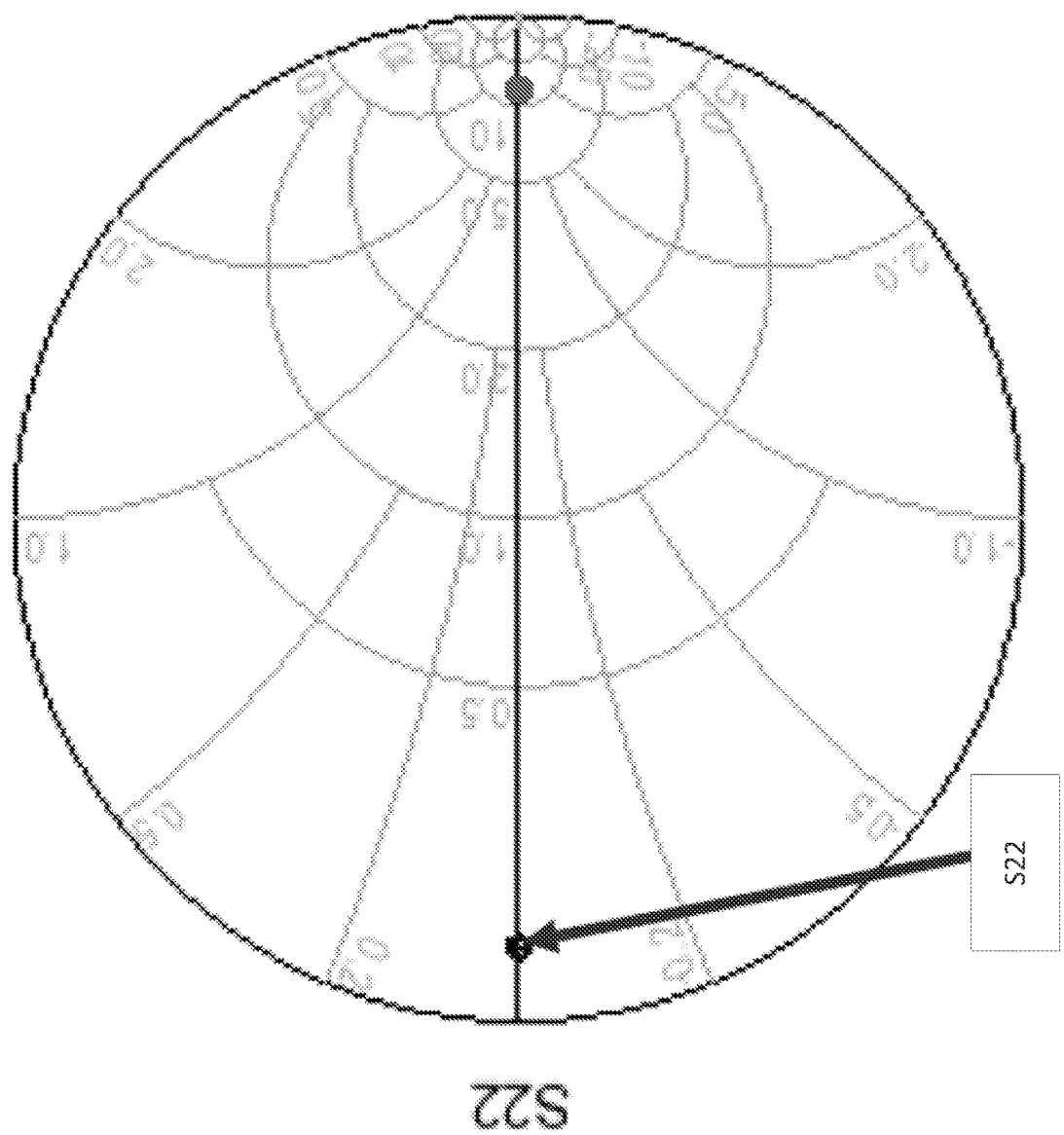
FIG. 18 illustrates the simplified S22 parameter of a power amplifier without implementation of the off mode output impedance control according to the disclosure.

FIG. 18 illustrates the simplified S22 parameter of a power amplifier without implementation of the off mode output impedance control according to the disclosure.

In particular, FIG. 18 illustrates the S22 parameter of a power amplifier, shown at a single frequency, without implementation of the off mode output impedance control 190 according to the disclosure. In this regard, FIG. 18 illustrates the RF power amplifier circuit 100 implemented without off mode S22 correction provided by the off mode output impedance control 190 according to the disclosure. Accordingly, the RF power amplifier circuit 100 operates such that the S22 parameter is approximately 4 ohms and approximately −1.5 dB, which is unsatisfactory for numerous systems.

Figure 19:
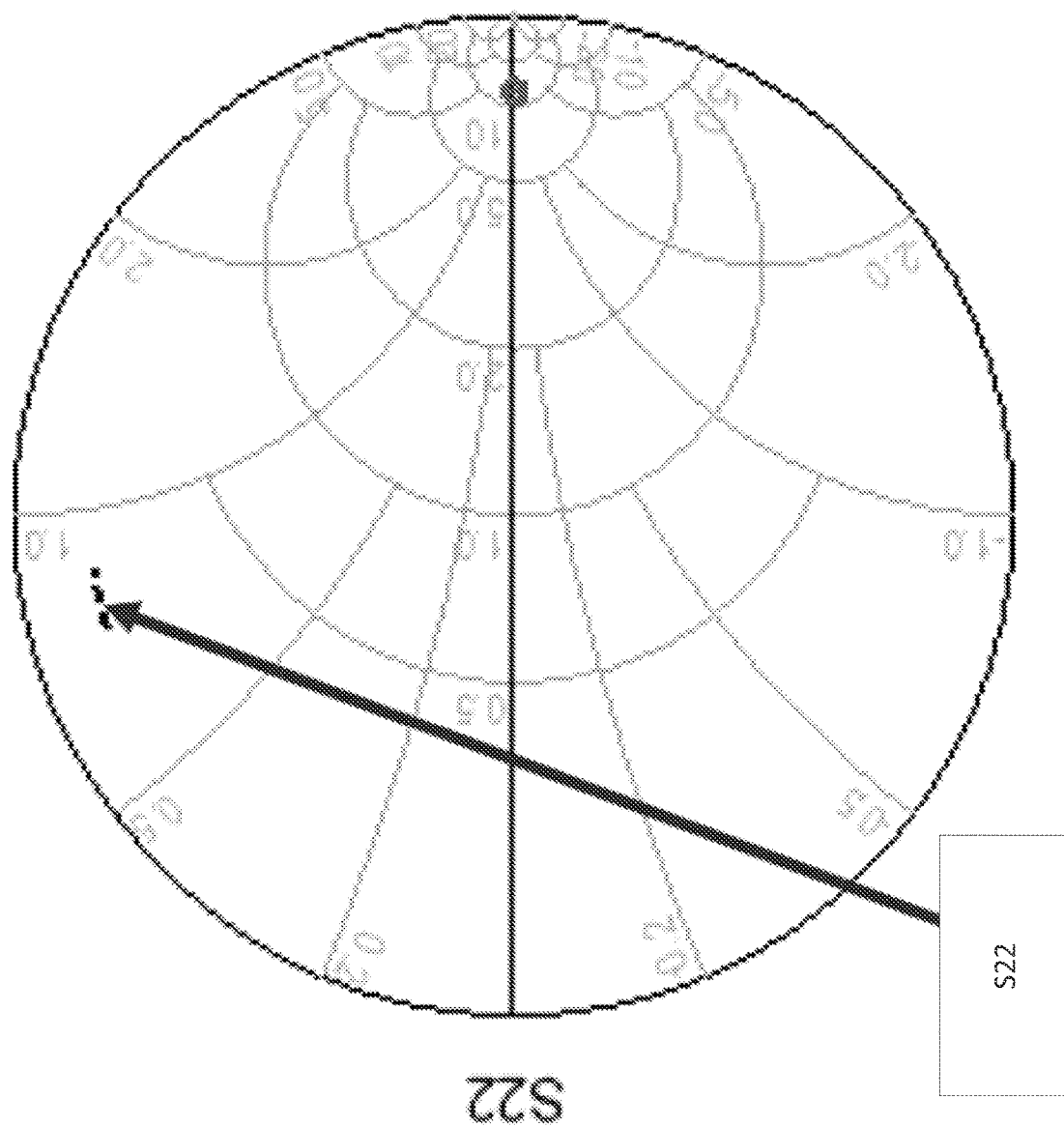
FIG. 19 illustrates the rotated S22 parameter of a power amplifier without full implementation of the off mode output impedance control according to the disclosure.

FIG. 19 illustrates the rotated S22 parameter of a power amplifier without full implementation of the off mode output impedance control according to the disclosure.

In particular, FIG. 19 illustrates the S22 parameter of a power amplifier without implementation of the off mode output impedance control 190 according to the disclosure and rotated by a 50 ohm line or equivalent circuit. In this regard, the RF power amplifier circuit 100 is implemented with no switch. Accordingly, the RF power amplifier circuit 100 operates such that the S22 parameter is approximately 4 ohms and approximately −1.5 dB, which is unsatisfactory for numerous systems.

Figure 20:
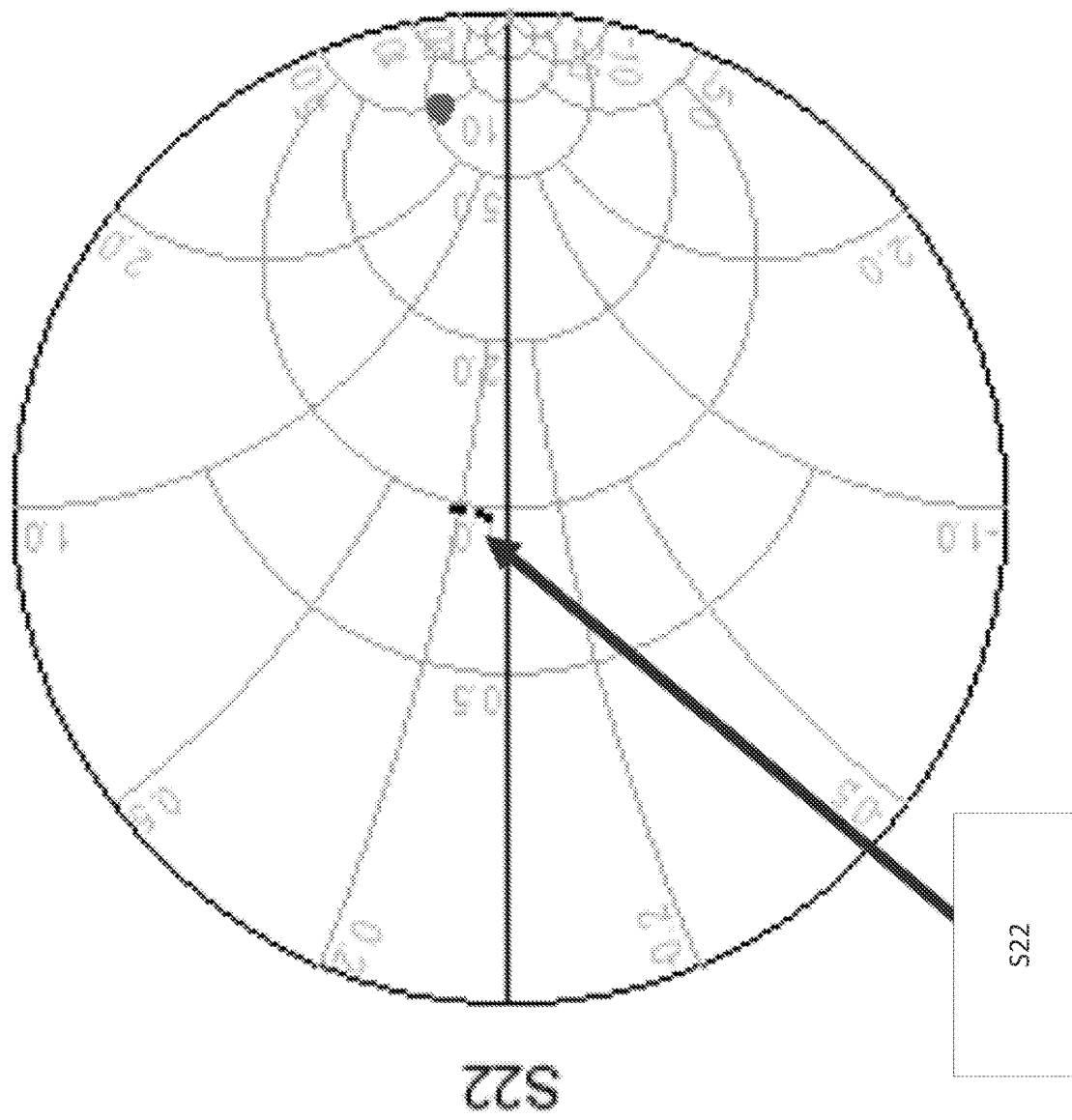
FIG. 20 illustrates the S22 parameter of a power amplifier with implementation of the off mode output impedance control according to the disclosure.

FIG. 20 illustrates the S22 parameter of a power amplifier with implementation of the off mode output impedance control according to the disclosure.

In particular, FIG. 20 illustrates the S22 parameter of a power amplifier with implementation of the off mode output impedance control 190 according to the disclosure. Accordingly, the RF power amplifier circuit 100 operates such that the S22 parameter is satisfactory for numerous systems.

Figure 21A:
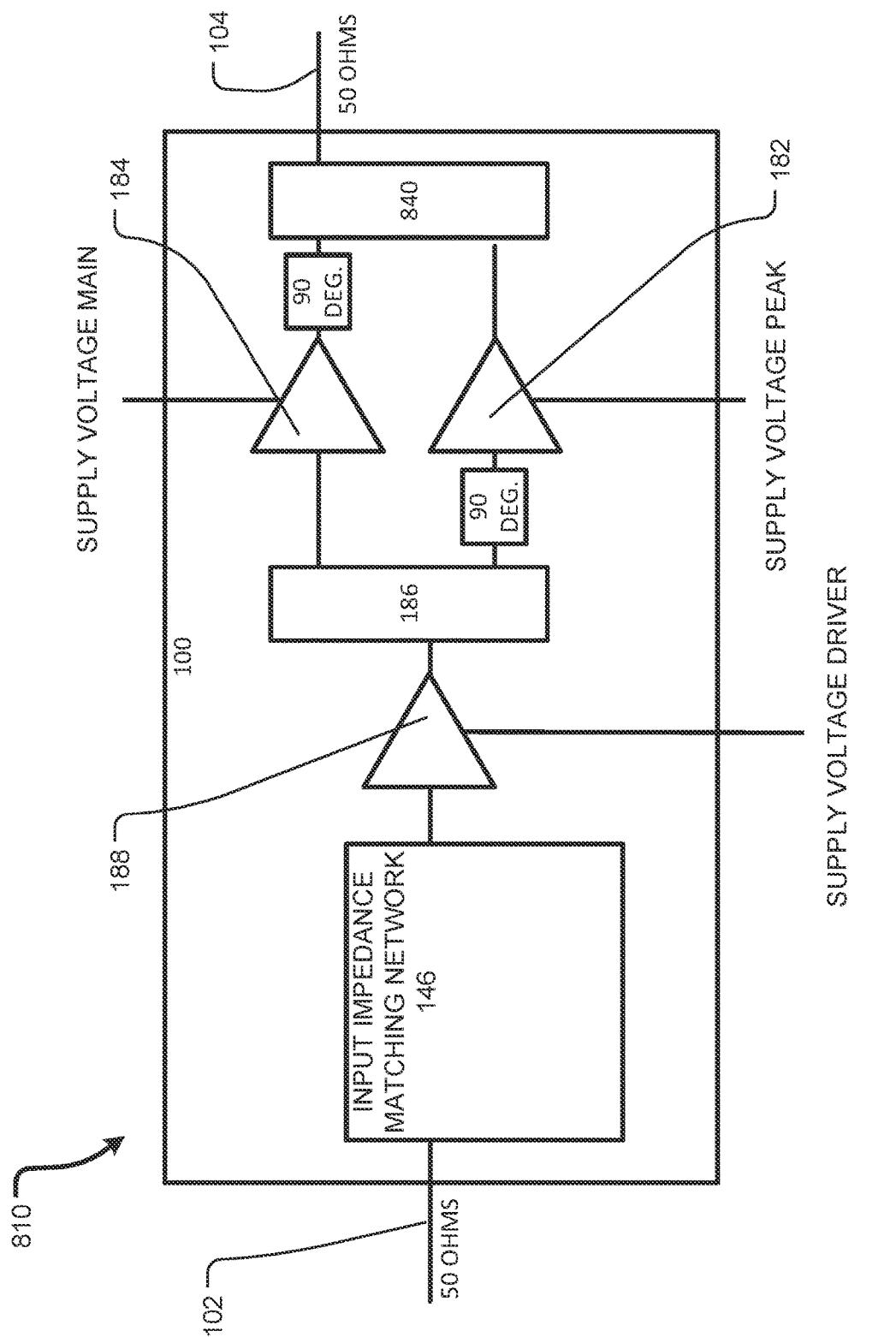
FIG. 21A illustrates a block diagram of an exemplary implementation of a RF power amplifier circuit according to FIG. 1 implemented as a multistage Doherty Power Amplifier Module (PAM).

FIG. 21A illustrates a block diagram of an exemplary implementation of a RF power amplifier circuit according to FIG. 1 implemented as a multistage Doherty Power Amplifier Module (PAM). (the output impedance matching network 147 and off mode output impedance control 190 not expressly illustrated in the Figure).

FIG. 21B illustrates an exemplary implementation of a Massive Multiple-Input and Multiple-Output (MMIMO) simplified front end antenna architecture according to aspects of the disclosure.

In particular, the aspects of FIG. 21A and FIG. 21B and the descriptions thereof may be implemented in any other aspects and/or figures of the RF power amplifier circuit 100 as described herein. FIG. 21A illustrates a block diagram of an exemplary implementation of the RF power amplifier circuit 100 implemented as a multistage Doherty Power Amplifier Module (PAM) 810. In this regard, the multistage Doherty Power Amplifier Module (PAM) 810 may implement the off mode output impedance control 190 (not illustrated) as described herein. As illustrated in FIG. 21A, the multistage Doherty Power Amplifier Module (PAM) 810 is implemented with two stages. However, the disclosure contemplates any number of stages. In aspects, the multistage Doherty Power Amplifier Module (PAM) 810 may be used in a Massive Multiple-Input and Multiple-Output (MMIMO) simplified front end antenna architecture 820 illustrated in FIG. 21B.

As illustrated in FIG. 21A, the multistage Doherty Power Amplifier Module (PAM) 810 may implement a driver stage. In particular, the multistage Doherty Power Amplifier Module (PAM) 810 may include an implementation of the RF amplifier device 108 that may be implemented as a driver stage 188. In particular aspects, the driver stage 188 may be implemented as a GaN driver stage.

Additionally, the multistage Doherty Power Amplifier Module (PAM) 810 may include an implementation of the RF amplifier device 108 that may be implemented as a peak Doherty amplifier device 182. In particular aspects, the peak Doherty amplifier device 182 may be implemented as a peak Doherty GaN amplifier device.

Additionally, the multistage Doherty Power Amplifier Module (PAM) 810 may include an implementation of the RF amplifier device 108 that may be implemented as a main (or carrier) Doherty amplifier device 184. In particular aspects, the main (or carrier) Doherty amplifier device 184 may be implemented as a main Doherty GaN amplifier device.

Additionally, the multistage Doherty Power Amplifier Module (PAM) 810 may include an interstage match/signal splitter 186. An output of the driver stage 188 may be input to the interstage match/signal splitter 186. An output of the interstage match/signal splitter 186 may be input to the main (or carrier) Doherty amplifier device 184 and the peak Doherty amplifier device 182.

Further, the multistage Doherty Power Amplifier Module (PAM) 810 may include a combiner/output match 840. An output from the main (or carrier) Doherty amplifier device 184 and the peak Doherty amplifier device 182 may be input to the combiner/output match 840.

Additionally, the multistage Doherty Power Amplifier Module (PAM) 810 may implement the input impedance matching network 146 and/or the off mode output impedance control 190 as described herein. In this regard, the input impedance matching network 146 and/or the off mode output impedance control 190 may see a Doherty amplifier of the multistage Doherty Power Amplifier Module (PAM) 810 as just an amplifier even though the Doherty amplifier of the multistage Doherty Power Amplifier Module (PAM) 810 may be implemented with a plurality transistors, such as the driver stage 188, the main (or carrier) Doherty amplifier device 184, and the peak Doherty amplifier device 182 as illustrated in FIG. 21A.

As illustrated in FIG. 21B, the Massive Multiple-Input and Multiple-Output (MMIMO) simplified front end antenna architecture 820 may be implemented with a signal splitter 822 connected to an array of multiple implementations of the multistage Doherty Power Amplifier Module (PAM) 810. In this regard, there may be 1 to n implementations of the multistage Doherty Power Amplifier Module (PAM) 810. Additionally, the Massive Multiple-Input and Multiple-Output (MMIMO) simplified front end antenna architecture 820 may include antenna elements 824. In aspects, there may be 1 to n implementations of the antenna elements 824 connected to the 1 to n implementations of the multistage Doherty Power Amplifier Module (PAM) 810 forming an antenna array 826. In this regard, each amplifier implementation of the multistage Doherty Power Amplifier Module (PAM) 810 implemented in the Massive Multiple-Input and Multiple-Output (MMIMO) simplified front end antenna architecture 820 of FIG. 21B may be implemented with an implementation of the multistage Doherty Power Amplifier Module (PAM) 810 illustrated in FIG. 21A.

In this regard, aspects of the disclosure implementing the off mode output impedance control 190 may be utilized with a single discrete amplifier, multiple parallel amplifier stages that are combined at the output, a Doherty amplifier where the peak and main RF signal are combined at the output, a single path-multiple stage amplifier, and/or the like.

Referring to FIG. 21B, any Power Amplifier, (in particular, but not exclusively, the single path multiple stage amplifier 1000 and/or the multiple path multiple stage amplifier 1100) may be substituted to the multistage Doherty Power Amplifier Module (PAM) 810 into the Massive Multiple-Input and Multiple-Output (MMIMO) architecture 820, and all would benefit the application of the Off Mode Output Impedance Control 190.

Figure 21C:
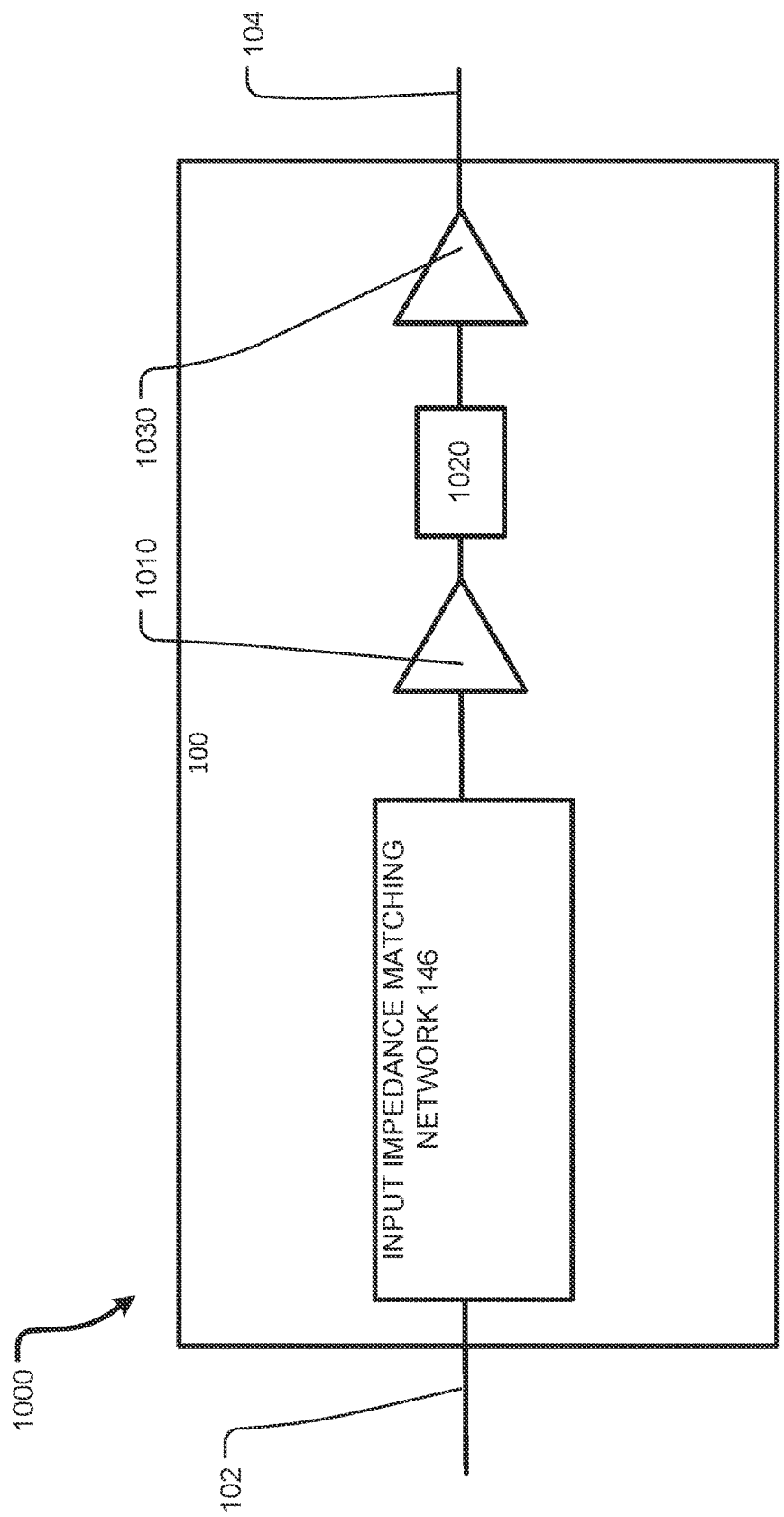
FIG. 21C illustrates a block diagram of an exemplary implementation of a RF power amplifier circuit according to FIG. 1 implemented as a single path multiple stage amplifier.

FIG. 21C illustrates a block diagram of an exemplary implementation of a RF power amplifier circuit according to FIG. 1 implemented as a single path multiple stage amplifier.

In particular, the aspects of FIG. 21C and the description thereof may be implemented in any other aspects and/or figures of the RF power amplifier circuit 100 as described herein. FIG. 21C illustrates a block diagram of an exemplary implementation of the RF power amplifier circuit 100 according to FIG. 1 implemented as a single path multiple stage amplifier 1000. In this regard, the single path multiple stage amplifier 1000 may implement the off mode output impedance control 190 (not illustrated) as described herein.

Referring to FIG. 21C, the single path multiple stage amplifier 1000 is schematically illustrated that includes a pre-amplifier 1010 and an output stage 1030 that are electrically cascaded. As shown in FIG. 21C, the single path multiple stage amplifier 1000 may include the pre-amplifier 1010, an inter-stage impedance matching network 1020, and the output stage 1030. Additionally, the single path multiple stage amplifier 1000 may implement the input impedance matching network 146 and/or the off mode output impedance control 190 as described herein. (the output impedance matching network 147 and off mode output impedance control 190 not expressly illustrated in the Figure).

The inter-stage impedance matching network 1020 may include, for example, inductors and/or capacitors arranged in any appropriate configuration in order to form a circuit that improves the impedance match between the output of the pre-amplifier 1010 and the input of the output stage 1030. The RF transistor amplifiers according to embodiments may be used to implement either or both of the pre-amplifier 1010 and the output stage 1030.

Figure 21D:
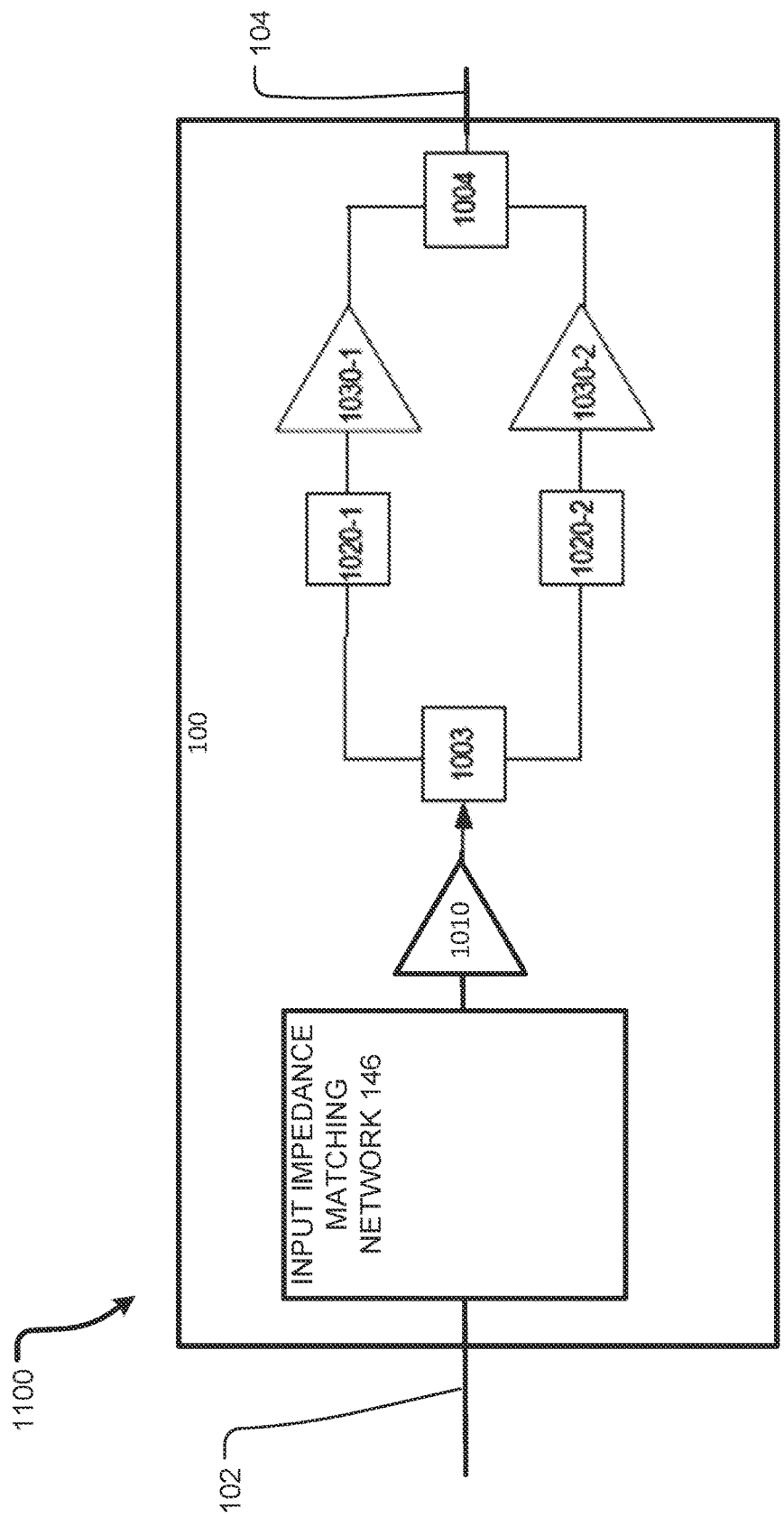
FIG. 21D illustrates a block diagram of an exemplary implementation of a RF power amplifier circuit according to FIG. 1 implemented as a multiple stage amplifier where the last stage is a Doherty.

FIG. 21D illustrates a block diagram of an exemplary implementation of a RF power amplifier circuit according to FIG. 1 implemented as a multiple path multiple stage amplifier where the last stage is a Doherty.

In particular, the aspects of FIG. 21D and the description thereof may be implemented in any other aspects and/or figures of the RF power amplifier circuit 100 as described herein. FIG. 21D illustrates a block diagram of an exemplary implementation of the RF power amplifier circuit 100 according to FIG. 1 implemented as a multiple path multiple stage amplifier 1100. In this regard, the multiple path multiple stage amplifier 1100 may implement the off mode output impedance control 190 (not illustrated) as described herein.

Referring to FIG. 21D, the multiple path multiple stage amplifier 1100 as schematically illustrated includes a pre-amplifier 1010, a pair of inter-stage impedance matching networks 1020-1, 1020-2, and a pair of main amplifiers 1030-1, 1030-2. A splitter 1003 and a combiner 1004 are also provided. The pair of main amplifiers 1030-1, 1030-2 output stage 1030 are arranged electrically in parallel; and the pre-amplifier 1010 output stage 1030 is electrically cascaded with the pair of main amplifiers 1030-1, 1030-2. Additionally, the multiple path multiple stage amplifier 1100 may implement the input impedance matching network 146 and/or the off mode output impedance control 190 as described herein (the output impedance matching network 147 and off mode output impedance control 190 not expressly illustrated in the Figures).

FIG. 21E illustrates a block diagram of an exemplary implementation of a RF power amplifier circuit according to FIG. 1 implemented as a multiple path multiple stage amplifier where the last stage is either a quadrature or balanced stage.

In particular, the aspects of FIG. 21E and the description thereof may be implemented in any other aspects and/or figures of the RF power amplifier circuit 100 as described herein. FIG. 21E illustrates a block diagram of an exemplary implementation of the RF power amplifier circuit 100 according to FIG. 1 implemented as another implementation of the multiple path multiple stage amplifier 1100.

Referring to FIG. 21E, the multiple path multiple stage amplifier 1100 as schematically illustrated includes a pre-amplifier 1010, an impedance matching network 1020, and a pair of main amplifiers 1030-1, 1030-2. A splitter 1003 and a combiner 1004 are also provided. The pair of main amplifiers 1030-1, 1030-2 are arranged electrically in parallel; and the pre-amplifier 1010 is electrically cascaded with the pair of main amplifiers 1030-1, 1030-2. In this regard, the pair of main amplifiers 1030-1, 1030-2 may implement the off mode output impedance control 190 (not illustrated) as described herein and each of them may implement the input impedance matching network 146 (the output impedance matching network 147 and the off mode output impedance control 190 not expressly illustrated in the Figure).

FIG. 22A illustrates a graph of power handling of the at least one switch circuit of FIG. 14E implementing off mode S22 correction according to aspects of the disclosure.

In particular, FIG. 22A illustrates a graph of power handling of the at least one switch circuit 206 of FIG. 14E implementing off mode S22 correction according to aspects of the disclosure. In this regard, power handling of the FIG. 14E circuit, which may relate to a current switch control, shows at about 51 dBm a peak power with marker m73.

FIG. 22B illustrates a graph of power handling of the at least one switch circuit of FIG. 14F implementing off mode S22 correction according to aspects of the disclosure.

In particular, FIG. 22B illustrates a graph of power handling of the at least one switch circuit 206 of FIG. 14F implementing off mode S22 correction according to aspects of the disclosure. In this regard, power handling of the FIG. 14F circuit, implementing a new switch control configuration, shows at about 55 dBm a peak power with marker m73, which is 4 dB better than the current switch control illustrated in FIG. 22B and relating to the at least one switch circuit 206 of FIG. 14F. Additionally, aspects of the disclosure implementing the off mode output impedance control 190 may provide an increase of the power handling/linearity of the RF amplifier device 108, such as implementations illustrated in FIG. 22B.

In one aspect, the RF amplifier device 108 may be implemented as a high-power transistor. In one aspect, the RF amplifier device 108 may be implemented as a high-power Laterally Diffused MOSFET (LDMOS), a high-power Gallium Nitride (GaN) MOSFET, a high-power GaN Laterally Diffused MOSFET (LDMOS), a high-power GaN High-Electron-Mobility Transistor (HEMT), an HBT (heterojunction bipolar transistor), CMOS (complementary metal-oxide semiconductor) devices, devices having material such as GaAs (Gallium arsenide), Si (silicon), SiGe (silicon-germanium), GaN, and/or the like, and/or a high-power GaN metal-semiconductor field-effect transistor (MESFET) transistor, a bipolar transistor, a discrete device, a Doherty arrangement, any device utilizing a bias feed, and the like. In one aspect, the off mode output impedance control 190 of the disclosure may be utilized by the various aspects of the disclosure to control the Off-mode output impedance, also referred to as S22) of the RF power amplifier circuit 100.

In one aspect, the RF amplifier device 108 may be implemented as a high-frequency transistor. In one aspect, the RF amplifier device 108 may be implemented as a high-frequency Laterally Diffused MOSFET (LDMOS), a high-frequency Gallium Nitride (GaN) MOSFET, a high-frequency GaN Laterally Diffused MOSFET (LDMOS), a high-frequency GaN High-Electron-Mobility Transistor (HEMT), an HBT (heterojunction bipolar transistor), CMOS (complementary metal-oxide semiconductor) devices, devices having material such as GaAs (Gallium arsenide), Si (silicon), SiGe (silicon-germanium), GaN, and/or the like, and/or a high-frequency GaN metal-semiconductor field-effect transistor (MESFET) transistor, a bipolar transistor, a discrete device, a Doherty arrangement, any device utilizing a bias feed, and the like. In one aspect, the off mode output impedance control 190 of the disclosure may be utilized by the various aspects of the disclosure to control the Off-mode output impedance, also referred to as S22) of the RF power amplifier circuit 100. of in other types of device technology.

Further, more than one the RF amplifier device 108 can be mounted in the RF power amplifier circuit 100 and connected in parallel. In this regard, a plurality of implementations of the RF amplifier device 108 may utilize the same type of transistors; and/or a plurality of implementations of the RF amplifier device 108 may utilize different types of transistors. In one aspect, the off mode output impedance control 190 of the disclosure may be utilized by the various aspects of the disclosure to control the Off-mode output impedance, also referred to as S22) of the RF power amplifier circuit 100.

In particular aspects, the RF power amplifier circuit 100 comprises: an input port 102; a RF output port 104; a RF amplifier device 108; and an off mode output impedance control 190. In particular aspects, the RF power amplifier circuit 100 wherein the RF power amplifier circuit 100 is configured to be implemented in a system where the RF power amplifier circuit 100 is configured to operate in an on mode and also configured in an off mode. In particular aspects, the RF power amplifier circuit 100 wherein the off mode output impedance control 190 is configured to address the Off-mode S22 parameters. In particular aspects, the RF power amplifier circuit 100 wherein the RF power amplifier circuit 100 is configured with the off mode output impedance control 190 without a circulator. In particular aspects, wherein the off mode output impedance control 190 is configured to control the S22 parameter in the Off mode to be between 40 ohms and 60 ohms. In particular aspects, the RF power amplifier circuit 100 wherein the off mode output impedance control 190 comprises: a mainline 202; an impedance circuit 204; and at least one switch circuit 206. In particular aspects, the RF power amplifier circuit 100 wherein the at least one switch circuit 206 is configured to be active when the RF power amplifier circuit 100 is not active; and wherein the at least one switch circuit 206 is configured to be not active when the RF power amplifier circuit 100 is active. In particular aspects, the RF power amplifier circuit 100 wherein the at least one switch circuit 206 comprises a control input 210. In particular aspects, the RF power amplifier circuit 100 wherein the control input 210 is configured to control the at least one switch circuit 206 to not be active when the RF power amplifier circuit 100 is active; and wherein the control input 210 is configured to control the at least one switch circuit 206 to be active when the RF power amplifier circuit 100 is not active. In particular aspects, the RF power amplifier circuit 100 wherein the control input 210 is generated by a controller associated with the RF power amplifier circuit 100. In particular aspects, the RF power amplifier circuit 100 wherein the off mode output impedance control 190 is configured to implement an impedance correction. In particular aspects, the RF power amplifier circuit 100 wherein the at least one switch circuit 206 is implemented by a plurality of switching devices in series. In particular aspects, the RF power amplifier circuit 100 wherein the at least one switch circuit 206 is implemented by at least one FET switch, at least one CMOS switch, at least one GaAs FET switch, and/or at least one GaN FET switch. In particular aspects, the RF power amplifier circuit 100 wherein the off mode output impedance control 190 is configured to provide correction of impedance for the RF power amplifier circuit 100 by closing the at least one switch circuit 206 and providing an impedance correction provided by the impedance circuit 204. In particular aspects, the RF power amplifier circuit 100 wherein the off mode output impedance control 190 further comprises a rotation circuit 212. In particular aspects, the RF power amplifier circuit 100 wherein the off mode output impedance control 190 is configured to implement two or more separate implementations of the at least one switch circuit 206 and two or more separate implementations of the impedance circuit 204. In particular aspects, the RF power amplifier circuit 100 wherein the impedance circuit 204 comprises one of the following: one or more capacitors, one or more capacitors in parallel with one or more resistors, one or more inductors, and/or one or more inductors in parallel with one or more resistors. In particular aspects, the RF power amplifier circuit 100 further comprising: an input impedance matching network 146, an output impedance matching network 147; and a reference potential port 106.

The following are a number of nonlimiting EXAMPLES of aspects of the disclosure.

One EXAMPLE includes: the RF power amplifier circuit includes an input port. The RF power amplifier circuit in addition includes a RF output port. The RF power amplifier circuit moreover includes a RF amplifier device. The RF power amplifier circuit also includes an off mode output impedance control.

The above-noted EXAMPLE may further include any one or a combination of more than one of the following EXAMPLES: The RF power amplifier circuit of the above-noted EXAMPLE where the RF power amplifier circuit is configured to be implemented in a system where the RF power amplifier circuit is configured to operate in an on mode and also configured in an off mode. The RF power amplifier circuit of the above-noted EXAMPLE where the off mode output impedance control is configured to address off mode S22 parameters. The RF power amplifier circuit of the above-noted EXAMPLE where the RF power amplifier circuit is configured with the off mode output impedance control without a circulator. The RF power amplifier circuit of the above-noted EXAMPLE where the off mode output impedance control is configured to control S22 parameter in an off mode to be between 40 ohms and 60 ohms. The RF power amplifier circuit of the above-noted EXAMPLE where the off mode output impedance control may include: a mainline; an impedance circuit; and at least one switch circuit. The RF power amplifier circuit of the above-noted EXAMPLE where the at least one switch circuit is configured to be active when the RF power amplifier circuit is not active; and where the at least one switch circuit is configured to be not active when the RF power amplifier circuit is active. The RF power amplifier circuit of the above-noted EXAMPLE where the at least one switch circuit may include a control input. The RF power amplifier circuit of the above-noted EXAMPLE where the control input is configured to control the at least one switch circuit to not be active when the RF power amplifier circuit is active; and where the control input is configured to control the at least one switch circuit to be active when the RF power amplifier circuit is not active. The RF power amplifier circuit of the above-noted EXAMPLE where the control input is generated by a controller associated with the RF power amplifier circuit. The RF power amplifier circuit of the above-noted EXAMPLE where the off mode output impedance control is configured to implement an impedance correction. The RF power amplifier circuit of the above-noted EXAMPLE where the at least one switch circuit is implemented by a plurality of switching devices in series. The RF power amplifier circuit of the above-noted EXAMPLE where the at least one switch circuit is implemented by at least one FET switch, at least one CMOS switch, at least one GaAs FET switch, and/or at least one GaN FET switch. The RF power amplifier circuit of the above-noted EXAMPLE where the off mode output impedance control is configured to provide correction of impedance for the RF power amplifier circuit by closing the at least one switch circuit and providing an impedance correction provided by the impedance circuit. The RF power amplifier circuit of the above-noted EXAMPLE where the off mode output impedance control is configured to implement two or more separate implementations of the at least one switch circuit and two or more separate implementations of the impedance circuit. The RF power amplifier circuit of the above-noted EXAMPLE where the impedance circuit may include one of the following: one or more capacitors, one or more capacitors in parallel with one or more resistors, one or more inductors, and/or one or more inductors in parallel with one or more resistors. The RF power amplifier circuit of the above-noted EXAMPLE where the off mode output impedance control further may include a rotation circuit. The RF power amplifier circuit of the above-noted EXAMPLE may include: an input impedance matching network; an output impedance matching network; and a reference potential port.

One EXAMPLE includes: the process includes providing an input port. The process in addition includes providing a RF output port. The process moreover includes providing a RF amplifier device. The process also includes providing an off mode output impedance control.

The above-noted EXAMPLE may further include any one or a combination of more than one of the following EXAMPLES: The process of the above-noted EXAMPLE where the RF power amplifier circuit is configured to be implemented in a system where the RF power amplifier circuit is configured to operate in an on mode and also configured in an off mode. The process of the above-noted EXAMPLE where the off mode output impedance control is configured to address off mode S22 parameters. The process of the above-noted EXAMPLE where the RF power amplifier circuit is configured with the off mode output impedance control without a circulator. The process of the above-noted EXAMPLE where the off mode output impedance control is configured to control S22 parameter in an off mode to be between 40 ohms and 60 ohms. The process of the above-noted EXAMPLE where the off mode output impedance control may include: providing a mainline; providing an impedance circuit; and providing at least one switch circuit. The process of the above-noted EXAMPLE where the at least one switch circuit is configured to be active when the RF power amplifier circuit is not active; and where the at least one switch circuit is configured to be not active when the RF power amplifier circuit is active. The process of the above-noted EXAMPLE where the at least one switch circuit may include a control input. The process of the above-noted EXAMPLE where the control input is configured to control the at least one switch circuit to not be active when the RF power amplifier circuit is active; and where the control input is configured to control the at least one switch circuit to be active when the RF power amplifier circuit is not active. The process of the above-noted EXAMPLE where the control input is generated by a controller associated with the RF power amplifier circuit. The process of the above-noted EXAMPLE where the off mode output impedance control is configured to implement an impedance correction. The process of the above-noted EXAMPLE where the at least one switch circuit is implemented by a plurality of switching devices in series. The process of the above-noted EXAMPLE where the at least one switch circuit is implemented by at least one FET switch, at least one CMOS switch, at least one GaAs FET switch, and/or at least one GaN FET switch. The process of the above-noted EXAMPLE where the off mode output impedance control is configured to provide correction of impedance for the RF power amplifier circuit by closing the at least one switch circuit and providing an impedance correction provided by the impedance circuit. The process of the above-noted EXAMPLE where the off mode output impedance control is configured to implement two or more separate implementations of the at least one switch circuit and two or more separate implementations of the impedance circuit. The process of the above-noted EXAMPLE where the impedance circuit may include one of the following: one or more capacitors, one or more capacitors in parallel with one or more resistors, one or more inductors, and/or one or more inductors in parallel with one or more resistors. The process of the above-noted EXAMPLE where the off mode output impedance control further may include a rotation circuit. The process of the above-noted EXAMPLE may include: providing an input impedance matching network; an output impedance matching network; and providing a reference potential port.

The following are a number of nonlimiting EXAMPLES of aspects of the disclosure.

One EXAMPLE includes: the RF power amplifier circuit includes an input port. The RF power amplifier circuit in addition includes a RF output port. The RF power amplifier circuit moreover includes a RF amplifier device. The RF power amplifier circuit also includes an output impedance control, where the output impedance control may an impedance circuit and at least one switch circuit.

The above-noted EXAMPLE may further include any one or a combination of more than one of the following EXAMPLES: The RF power amplifier circuit of the above-noted EXAMPLE where the RF power amplifier circuit is configured to be implemented in a system where the RF power amplifier circuit is configured to operate in an on mode and also configured in an off mode. The RF power amplifier circuit of the above-noted EXAMPLE where the output impedance control is configured to address off mode S22 parameters. The RF power amplifier circuit of the above-noted EXAMPLE where the RF power amplifier circuit is configured with the output impedance control without a circulator. The RF power amplifier circuit of the above-noted EXAMPLE where the output impedance control is configured to control S22 parameter in an off mode to be between 40 ohms and 60 ohms. The RF power amplifier circuit of the above-noted EXAMPLE where the at least one switch circuit is configured to be active when the RF power amplifier circuit is not active; and where the at least one switch circuit is configured to be not active when the RF power amplifier circuit is active. The RF power amplifier circuit of the above-noted EXAMPLE where the at least one switch circuit may include a control input. The RF power amplifier circuit of the above-noted EXAMPLE where the control input is configured to control the at least one switch circuit to not be active when the RF power amplifier circuit is active; and where the control input is configured to control the at least one switch circuit to be active when the RF power amplifier circuit is not active. The RF power amplifier circuit of the above-noted EXAMPLE where the control input is generated by a controller associated with the RF power amplifier circuit. The RF power amplifier circuit of the above-noted EXAMPLE where the output impedance control is configured to implement an impedance correction. The RF power amplifier circuit of the above-noted EXAMPLE where the at least one switch circuit is implemented by a plurality of switching devices in series. The RF power amplifier circuit of the above-noted EXAMPLE where the at least one switch circuit is implemented by at least one FET switch, at least one CMOS switch, at least one GaAs FET switch, and/or at least one GaN FET switch. The RF power amplifier circuit of the above-noted EXAMPLE where the output impedance control is configured to provide correction of impedance for the RF power amplifier circuit by closing the at least one switch circuit and providing an impedance correction provided by the impedance circuit. The RF power amplifier circuit of the above-noted EXAMPLE where the output impedance control further may include a rotation circuit. The RF power amplifier circuit of the above-noted EXAMPLE where the output impedance control is configured to implement two or more separate implementations of the at least one switch circuit and two or more separate implementations of the impedance circuit. The RF power amplifier circuit of the above-noted EXAMPLE where the impedance circuit may include one of the following: one or more capacitors, one or more capacitors in parallel with one or more resistors, one or more inductors, and/or one or more inductors in parallel with one or more resistors. The RF power amplifier circuit of the above-noted EXAMPLE may include: an input impedance matching network; an output impedance matching network; and a reference potential port.

One EXAMPLE includes: the process includes providing an input port. The process in addition includes providing a RF output port. The process moreover includes providing a RF amplifier device. The process also includes providing an output impedance control, where the output impedance control may include an impedance circuit and at least one switch circuit.

The above-noted EXAMPLE may further include any one or a combination of more than one of the following EXAMPLES: The process of the above-noted EXAMPLE where the RF power amplifier circuit is configured to be implemented in a system where the RF power amplifier circuit is configured to operate in an on mode and also configured in an off mode. The process of the above-noted EXAMPLE where the output impedance control is configured to address off mode S22 parameters. The process of the above-noted EXAMPLE where the RF power amplifier circuit is configured with the output impedance control without a circulator. The process of the above-noted EXAMPLE where the output impedance control is configured to control S22 parameter in an off mode to be between 40 ohms and 60 ohms. The process of the above-noted EXAMPLE where the at least one switch circuit is configured to be active when the RF power amplifier circuit is not active; and where the at least one switch circuit is configured to be not active when the RF power amplifier circuit is active. The process of the above-noted EXAMPLE where the at least one switch circuit may include a control input. The process of the above-noted EXAMPLE where the control input is configured to control the at least one switch circuit to not be active when the RF power amplifier circuit is active; and where the control input is configured to control the at least one switch circuit to be active when the RF power amplifier circuit is not active. The process of the above-noted EXAMPLE where the control input is generated by a controller associated with the RF power amplifier circuit. The process of the above-noted EXAMPLE where the output impedance control is configured to implement an impedance correction. The process of the above-noted EXAMPLE where the at least one switch circuit is implemented by a plurality of switching devices in series. The process of the above-noted EXAMPLE where the at least one switch circuit is implemented by at least one FET switch, at least one CMOS switch, at least one GaAs FET switch, and/or at least one GaN FET switch. The process of the above-noted EXAMPLE where the output impedance control is configured to provide correction of impedance for the RF power amplifier circuit by closing the at least one switch circuit and providing an impedance correction provided by the impedance circuit. The process of the above-noted EXAMPLE where the output impedance control further may include a rotation circuit. The process of the above-noted EXAMPLE where the output impedance control is configured to implement two or more separate implementations of the at least one switch circuit and two or more separate implementations of the impedance circuit. The process of the above-noted EXAMPLE where the impedance circuit may include one of the following: one or more capacitors, one or more capacitors in parallel with one or more resistors, one or more inductors, and/or one or more inductors in parallel with one or more resistors. The process of the above-noted EXAMPLE may include: providing an input impedance matching network; an output impedance matching network; and providing a reference potential port.

In particular, connected as described herein may include coupling or connections that may include leads, wire bonding, an adhesive, soldering, sintering, eutectic bonding, thermal compression bonding, ultrasonic bonding/welding, a clip component, and/or the like as described herein. The connection may be through intervening structures or components or the connection may be a direct connection.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a solid mass of material by heat and/or pressure. The sintering process may operate without melting the material to the point of liquefaction. The sintering process may include sintering of metallic powders. The sintering process may include sintering in a vacuum. The sintering process may include sintering with the use of a protective gas.

The eutectic bonding of the disclosure may utilize a bonding process with an intermediate metal layer that may form a eutectic system. The eutectic system may be used between surfaces to be connected. The eutectic bonding may utilize eutectic metals that may be alloys that transform from solid to liquid state, or from liquid to solid state, at a specific composition and temperature without passing a two-phase equilibrium. The eutectic alloys may be deposited by sputtering, dual source evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

In particular aspects, the RF power amplifier circuit 100 and/or the RF amplifier of the disclosure may be utilized in wireless base stations that connect to a wireless device. In further aspects, the RF power amplifier circuit 100 and/or the RF amplifier of the disclosure may be utilized in amplifiers implemented by wireless base stations that connect to a wireless device. In further aspects, the RF power amplifier circuit 100 and/or the RF amplifier of the disclosure may be utilized in wireless devices. In further aspects, the RF power amplifier circuit 100 and/or the RF amplifier of the disclosure may be utilized in amplifiers implemented in wireless devices.

In this disclosure it is to be understood that reference to a wireless device is intended to encompass electronic devices such as mobile phones, tablet computers, gaming systems, MP3 players, personal computers, PDAs, user equipment (UE), and the like. A "wireless device" is intended to encompass any compatible mobile technology computing device that can connect to a wireless communication network, such as mobile phones, mobile equipment, mobile stations, user equipment, cellular phones, smartphones, handsets, wireless dongles, remote alert devices, Internet of things (IoT) based wireless devices, or other mobile computing devices that may be supported by a wireless network. The wireless device may utilize wireless communication technologies like GSM, CDMA, wireless local loop, Wi-Fi, WiMAX, other wide area network (WAN) technology, 3G technology, 4G technology, 5G technology, LTE technology, and/or the like.

In this disclosure it is to be understood that reference to a wireless base station is intended to cover base transceiver station (BTS), node B devices, Base Station (BS) devices, evolved node B devices, and the like that facilitate wireless communication between wireless devices and a network. The wireless base station and/or the network may utilize wireless communication technologies like GSM, CDMA, wireless local loop, Wi-Fi, WiMAX, other wide area network (WAN) technology, 3G technology, 4G technology, 5G technology, LTE technology, and the like. However, aspects of the disclosure are applicable to other implementations as well.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An RF power amplifier circuit comprising:
an input port;
an RF output port;
an RF amplifier device; and
an off mode output impedance control being operable when the RF amplifier device is in an off mode.

2. The RF power amplifier circuit according to claim 1
wherein the RF power amplifier circuit is configured to be implemented in a system where the RF power amplifier circuit is configured to operate in an on mode and also configured in an off mode; and
wherein the off mode output impedance control is configured and/or operable to provide an output impedance when the RF amplifier device is in an off mode.

3. The RF power amplifier circuit according to claim 1
wherein the off mode output impedance control is configured to address off mode S22 parameters when the RF amplifier device is in an off mode;
wherein the off mode output impedance control is configured to not be active when the RF power amplifier circuit is active; and
wherein the off mode output impedance control is configured to be active when the RF power amplifier circuit is not active.

4. The RF power amplifier circuit according to claim 1
wherein the RF power amplifier circuit is configured with the off mode output impedance control without a circulator; and
wherein the off mode output impedance control is connected to ground.

5. The RF power amplifier circuit according to claim 1 wherein the off mode output impedance control is configured to control an S22 parameter when the RF amplifier device is in an off mode to be between 40 ohms and 60 ohms.

6. The RF power amplifier circuit according to claim 1
wherein the off mode output impedance control comprises:
a mainline connected to the RF output port and an output terminal of the RF amplifier device;
an impedance circuit connected to the mainline; and
at least one switch circuit connected to the mainline and the impedance circuit.

7. The RF power amplifier circuit according to claim 6
wherein the at least one switch circuit is configured to be active when the RF power amplifier circuit is not active; and
wherein the at least one switch circuit is configured to be not active when the RF power amplifier circuit is active.

8. The RF power amplifier circuit according to claim 6 wherein the at least one switch circuit comprises a control input.

9. The RF power amplifier circuit according to claim 8
wherein the control input is configured to control the at least one switch circuit to not be active when the RF power amplifier circuit is active; and
wherein the control input is configured to control the at least one switch circuit to be active when the RF power amplifier circuit is not active.

10. The RF power amplifier circuit according to claim 8 wherein the control input is generated by a controller associated with the RF power amplifier circuit.

11. The RF power amplifier circuit according to claim 6 wherein the off mode output impedance control is configured to implement an impedance correction.

12. The RF power amplifier circuit according to claim 6 wherein the at least one switch circuit is implemented by a plurality of switching devices in series.

13. The RF power amplifier circuit according to claim 6 wherein the at least one switch circuit is implemented by at least one FET switch, at least one CMOS switch, at least one GaAs FET switch, and/or at least one GaN FET switch.

14. The RF power amplifier circuit according to claim 6 wherein the off mode output impedance control is configured to provide correction of impedance for the RF power amplifier circuit by closing the at least one switch circuit and providing an impedance correction provided by the impedance circuit.

15. The RF power amplifier circuit according to claim 1 wherein the off mode output impedance control further comprises a rotation circuit.

16. The RF power amplifier circuit according to claim 6 wherein the off mode output impedance control is configured to implement two or more separate implementations of the at least one switch circuit and two or more separate implementations of the impedance circuit.

17. The RF power amplifier circuit according to claim 6 wherein the impedance circuit comprises one of the following: one or more capacitors, one or more capacitors in parallel with one or more resistors, one or more inductors, and/or one or more inductors in parallel with one or more resistors.

18. The RF power amplifier circuit according to claim 6 wherein the off mode output impedance control is configured to receive a control input from a controller.

19. The RF power amplifier circuit according to claim 18 wherein the off mode output impedance control further comprises a gate driver configured to be responsive to the controller.

20. The RF power amplifier circuit according to claim 18 wherein the off mode output impedance control further comprises a level down circuit configured to be responsive to the controller.

21. The RF power amplifier circuit according to claim 20 wherein the level down circuit is configured to limit generation of spurious signals in a transmit chain of the RF power amplifier circuit.

22. The RF power amplifier circuit according to claim 20 wherein the level down circuit is configured to control an ON/OFF of the at least one switch circuit.

23. The RF power amplifier circuit according to claim 20
wherein the RF power amplifier circuit is configured to generate a single voltage; and
wherein the level down circuit is configured to be implemented using the single voltage.

24. The RF power amplifier circuit according to claim 1 further comprising:
an output impedance matching network connected to the off mode output impedance control;
an input impedance matching network; and
a reference potential port,
wherein the off mode output impedance control is configured to not be active when the RF power amplifier circuit is active; and wherein the off mode output impedance control is configured to be active when the RF power amplifier circuit is not active.

25. A process of implementing an RF power amplifier circuit comprising:
providing an input port;
providing an RF output port;
providing an RF amplifier device; and
operating an off mode output impedance control when the RF amplifier device is in an off mode.

* * * * *